United States Patent
Aruga et al.

(10) Patent No.: US 6,251,232 B1
(45) Date of Patent: Jun. 26, 2001

(54) METHOD OF REMOVING ACCUMULATED FILMS FROM THE SURFACE OF SUBSTRATE HOLDERS IN FILM DEPOSITION APPARATUS, AND FILM DEPOSITION APPARATUS

(75) Inventors: Yoshiki Aruga; Koji Maeda, both of Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/453,886

(22) Filed: Feb. 22, 2000

(30) Foreign Application Priority Data

Mar. 26, 1999 (JP) .................................. 11-084855
Nov. 24, 1999 (JP) .................................. 11-332874

(51) Int. Cl.⁷ .................................................. C23C 14/34
(52) U.S. Cl. ............................. 204/192.32; 204/298.25; 204/298.26; 204/298.31; 204/298.35; 216/37; 216/63; 216/66; 118/620; 118/503; 134/1; 134/1.1; 134/66
(58) Field of Search .................. 204/192.32, 298.25, 204/298.26, 298.31, 298.35; 216/37, 63, 66; 118/620, 503; 134/1, 1.1, 66

(56) References Cited

U.S. PATENT DOCUMENTS

| | | | |
|---|---|---|---|
| 2,730,987 | 1/1956 | Nelson | 118/49 |
| 4,259,433 | * 3/1981 | Mizobuchi et al. | 430/296 |
| 4,261,808 | 4/1981 | Walter | 204/298 |
| 4,500,407 | 2/1985 | Boys et al. | 204/298 |
| 4,643,629 | 2/1987 | Takahashi et al. | 414/331 |
| 4,674,621 | 6/1987 | Takahashi | 198/378 |
| 4,722,298 | 2/1988 | Rubin et al. | 118/715 |
| 4,795,299 | 1/1989 | Boys et al. | 414/217 |
| 4,825,808 | 5/1989 | Takahashi et al. | 118/719 |
| 4,981,408 | 1/1991 | Hughes et al. | 414/217 |
| 5,024,570 | 6/1991 | Kiriseko et al. | 414/222 |
| 5,047,130 | 9/1991 | Akao et al. | 204/192.12 |

(List continued on next page.)

FOREIGN PATENT DOCUMENTS

| | | | |
|---|---|---|---|
| 2900724 | 7/1980 | (DE) | C23C/13/10 |
| 59-228932 | 12/1984 | (JP) | B01J/19/00 |
| 61-170568 | 8/1986 | (JP) | C23C/14/56 |
| 62-20347 | 1/1987 | (JP) | H01L/21/68 |
| 62-230977 | 10/1987 | (JP) | C23C/14/56 |
| 63-161636 | 7/1988 | (JP) | H01L/21/68 |
| 63-303062 | 12/1988 | (JP) | C23C/14/22 |
| 1-230250 | 9/1989 | (JP) | H01L/21/88 |
| 4-115513 | 4/1992 | (JP) | H01L/21/02 |
| 4-275449 | 10/1992 | (JP) | H01L/21/68 |

OTHER PUBLICATIONS

ANELVA, Disk Sputtering System C–3010, New Product, Sep. 1997.
ANELVA Corporate Profile: Vacuum and Thin Film Technologies, 2000.

*Primary Examiner*—Nam Nguyen
*Assistant Examiner*—Steven H. VerSteeg
(74) *Attorney, Agent, or Firm*—Burns, Doane, Swecker & Mathis, LLP

(57) ABSTRACT

A substrate holder 90 where a thin film has accumulated on the surface of the holding claws 91 is transferred in a state where no substrate 9 is being held into a film removal chamber 70 which is established branching off in such a way that the vacuum is connected from the square transfer path 80 along which a plurality of vacuum chambers including the film deposition chambers 51, 52, 53, 54 and 50 is established. A high frequency power supply 73 is connected via the movable electrode 74 to the holder body 92 and a high frequency electric field is established within the film removal chamber 70. A plasma is formed by generating a high frequency discharge in the gas which is being delivered by means of the gas delivery system 72 and the accumulated film on the surface of the holding claws 91 is removed in a vacuum by sputter etching due to ion impacts.

27 Claims, 11 Drawing Sheets

U.S. PATENT DOCUMENTS

| | | | |
|---|---|---|---|
| 5,076,205 | 12/1991 | Vowles et al. | 118/719 |
| 5,221,450 * | 6/1993 | Hattori et al. | 204/192.32 |
| 5,277,778 | 1/1994 | Daube et al. | 204/298.19 |
| 5,288,329 | 2/1994 | Nakamura et al. | 118/729 |
| 5,376,212 | 12/1994 | Saiki | 156/345 |
| 5,377,816 | 1/1995 | Deligi et al. | 198/619 |
| 5,482,607 | 1/1996 | Hashimoto et al. | 204/298.25 |
| 5,561,868 | 10/1996 | Campbell | 4/560.1 |
| 5,651,868 | 7/1997 | Canady et al. | 204/298.05 |
| 5,695,564 | 12/1997 | Imahashi | 118/719 |
| 5,846,328 * | 12/1998 | Aruga et al. | 118/718 |
| 5,906,866 * | 5/1999 | Webb | 427/534 |
| 5,911,833 * | 6/1999 | Denison et al. | 134/1.1 |
| 6,027,618 | 2/2000 | Aruga et al. | 204/192.12 |

* cited by examiner

METHOD OF REMOVING ACCUMULATED FILMS FROM THE SURFACE OF SUBSTRATE HOLDERS IN FILM DEPOSITION APPARATUS, AND FILM DEPOSITION APPARATUS

CROSS-REFERENCE TO RELATED APPLICATIONS

Referenced-applications

The present application claims the priority of Japanese Patent Application No. 11-84855, filed on Mar. 26, 1999, and Japanese Patent Application No. 11-332874, filed on Nov. 24, 1999, the subject matter of both Japanese applications being hereby incorporated herein by reference.

STATEMENT REGARDING FEDERALLY SPONSORED RESEARCH

Not Applicable

REFERENCE TO A MICROFICHE APPENDIX

Not Applicable

BACKGROUND OF THE INVENTION

1. Description of Related Art

The formation of a prescribed thin film on the surface of a substrate is carried out frequently in the production of semiconductor devices such as LSI, display apparatus such as liquid crystal displays and information-recording disks such as hard disks. Film deposition apparatus of this type are furnished with substrate holders of a prescribed construction for holding the substrates in the prescribed position within the film deposition chambers in which film deposition is carried out. The thin film should in fact be deposited only on the substrates, but particles which accumulate to form a thin film are inevitably deposited not only on the surface of the substrate, but also on the surface of the substrate holders. Consequently thin films inevitably accumulate on the surface of the substrate holders as well. The accumulation of a film on the substrate holder surface in this way causes problems such as a loss of processing quality to arise. This is described below using the film deposition apparatus which is used with substrates for information-recording disk purposes as an example.

A plan view which shows the outline construction of a conventional film deposition apparatus for information-recording disk substrates is shown in FIG. 10. The apparatus shown in FIG. 10 comprises a plurality of vacuum chambers 1, 2, 501 which are connected in an airtight manner along a transfer path 80. Furthermore, substrate holders 90 which hold the substrates 9 and a transfer mechanism (which is not shown in the drawing) which moves the substrate holders 90 along the transfer path 80 are provided.

A front outline view which shows the construction of the substrate holder 90 which is shown in FIG. 10 is shown in FIG. 11. The substrate holder 90 includes a plate-like holder body 92 and holding claws 91 which are fined to the holder body 92. The holding claws 91 are arranged in groups of three so as to hold a single substrate 9. Each holding claw 91 comprises a metal plate spring which has been bent into an L-shape. The holder body 92, as shown in FIG. 11, has two circular openings which are slightly larger than the substrates 9. The holder body 92 has roughly L-shaped openings extending from the circular openings and each holding claw 91 is located in such an opening.

The holding claws 91 are fixed to the holder body 92 with screws, and the tips engage with the circumferential edge of the substrate 9. The tips of the holding claws 91 are V-shaped. Thus, the edges of the substrates 9 are dropped onto and enter the V-shaped tips.

Of the three such holding claws 91, the holding claw 91 which is located on the lower side is a movable holding claw. That is to say, there is provided a lever 93 which presses down this holding claw 91 against its elasticity. When mounting the substrate 9 on the substrate holder 90, the holding claw 91 on the bottom side is pressed down by means of the lever 93 and the substrate 9 is located in the circular opening in the middle of the holder body 92. Then, the lever 93 is released and the lower side holding claw 91 is returned to its original state by means of its elasticity. As a result the substrate 9 is engaged by the three holding claws 91, and a state in which two substrates 9 are being held on a single substrate holder 90 is achieved. The same procedure, but in reverse, is used to recover the substrates 9 from the substrate holder 90.

Moreover, as is clear from FIG. 11, the substrates 9 are held on the substrate holder 90 in a vertically mounted state. The surfaces of the substrates 9 which are held on the substrate holder 90 are therefore arranged facing toward the side of the transfer path 80.

One of the plurality of vacuum chambers shown in FIG. 10 is a load-lock chamber 1 in which the substrates 9 are mounted onto the substrate holders 90, and another is an unload-lock chamber 2 in which the substrates 9 are recovered from the substrate holders 90. Furthermore, one of the vacuum chambers 501 is a film deposition chamber in which the prescribed thin film is formed on the surfaces of the substrates 9. Moreover, the other vacuum chambers 501 may be constructed as heating chambers in which the substrates 9 are preheated or they may be constructed as second film deposition chambers in those cases where multilayer films are being deposited.

Moreover, in the apparatus shown in FIG. 10, a return mechanism, not shown in the drawing, which returns the substrate holders 90 from which the substrates 9 have been recovered in the unload-lock chamber 2 to the load-lock chamber 1 is established. Hence, the substrate holders 90 are circulated through the plurality of vacuum chambers 1, 2, 501 and the return mechanism so that they can be used to hold substrates 9 repeatedly.

2. Field of the Invention

The inventions of this application concern film deposition apparatus in which prescribed thin films are deposited on the surface of a substrate, and more precisely it concerns the removal of the films which accumulate on the surfaces of the substrate holders which hold the substrates in apparatus of this type.

BRIEF SUMMARY OF THE INVENTION

In conventional film deposition apparatus as described above, the substrates 9 are transferred into the film deposition chamber 501 in a state where they are being held by a substrate holder 90 and a film is deposited on the surfaces of the substrates 9. Consequently, a thin film is deposited not just on the surfaces of the substrates 9 but it also accumulates on the surface of the substrate holder 90. This results in a problem as described below. The point is described here with reference to FIG. 12. FIG. 12 is an explanatory drawing of the problem which arises with the conventional apparatus.

The tip of a holding claw 91 and the circumferential edge of a substrate 9 which has been engaged in this tip is shown in FIG. 12(1). First of all, as shown in FIG. 12(1), a thin film 94 is accumulated not just on the surface of the substrate 9, but also on the surface of the holding claw 91. In more practical terms, the thin film 94 is accumulated extending from the holding claw 91 up to the circumferential edge of the substrate 9. Hence, when the substrate 9 is recovered from the substrate holder 90 after film deposition, the situation is as shown in FIG. 12(2) where the thin film 94 remains on the surface of the V-shaped tip of the holding claw 91, except in the part where the substrate 9 had been located. The substrate holder 90 is used to hold substrates 9 repeatedly, as mentioned earlier, but when the next substrate 9 is mounted it is not held in exactly the same position as the earlier substrate. That is to say, the circumferential edge of the substrate 9 is inevitably mounted in the accumulated thin film 94, as shown in FIG. 12 (3).

At this time the thin film 94 is peeled off by the impact of mounting the substrate 9, and the peeled off thin film 94 forms particles 95 of a certain size, which are dispersed. If the particles 95 become attached to the surface of the substrate 9, then this results in a local film thickness abnormality. A local film thickness abnormality is likely to cause a sector failure in the cases of an information-recording disk such as a hard disk.

With the latest information-recording disks in particular, even the region of the surface of the substrate 9 close to the circumferential edge is now being used in order to increase the recording capacity. The particles mentioned above tend to be mostly attached to the parts around the edges within a limited distance from the circumferential edge and few tend to become attached in the middle parts. Consequently there was no great problem when the parts close to the circumferential edge were not being used, but there is a serious problem now that more and more of the part near to the circumferential edge is being used.

Moreover, the inter-sector spacing of the latest information-recording disks has been reduced in order to increase the recording density. Consequently, even a slight film thickness abnormality, such as the formation of a protrusion, is likely to result in a recording error. For example, in the case of a hard disk for high density information recording at a rate of some 20 gigabytes/square inch, an information error will inevitably arise if just a small particle of a size as small as 0.2 $\mu$m becomes attached to the surface.

Rendering the thin film 94 which has accumulated on the surface of the substrate holder 90 less likely to peel away has been considered as a means of resolving such problems. For example, the surfaces of the holding claws 91 have been subjected to a sand-blasting treatment in which fine particles, such as sand, are blown onto the surface so as to form a fine roughness on the surface. The accumulated thin film is then formed in a state were it is engaged upon this roughness and so it is less likely to peel away.

In another method, roughness is formed at the surface by spraying with a molten metal, for example.

However, if a sand-blasting treatment or a melt-spraying treatment is carried out, then the holding claws 91 are easily damaged. The holding claws 91 must be as thin as possible so that the arrival of film forming material at the surface of the substrate 9 during film deposition is not impeded. Hence, there is a problem in that if a sand-blasting treatment or melt spraying treatment is carried out then the holding claws 91 may be deformed or they may lose their elasticity.

The inventions of the present application have been devised to resolve such problems, and they have technical significance in that the problems which are caused by the peeling off of the thin film which accumulates on the substrate holder are resolved effectively.

In order to resolve the abovementioned problems, in film deposition apparatus in which prescribed thin films are formed on the surface of a substrate while the substrate is being held by means of a substrate holder in a film deposition chamber which is being maintained under vacuum pressure, the substrate holder, without being taken out into the atmosphere, is preferably located either in another vacuum chamber which is connected in an airtight manner to the film deposition chamber, or in the film deposition chamber itself, and removal of the accumulated film from the surface of the substrate holder is carried out in a vacuum.

The removal is preferably carried out in a state where no substrate is being held on the substrate holder.

The substrate holder is preferably a holder which, while holding the substrate, transfers the substrate between the film deposition chamber and other vacuum chambers which are connected to the film deposition chamber.

The removal is preferably carried out by causing the accumulated film to peel away from the surface of the substrate holder by imparting heat, light or electrical energy to the accumulated film.

The removal is preferably carried out by radiating ions onto the aforementioned accumulated film and the aforementioned accumulated film is sputter-etched by the ion impacts.

The removal is preferably carried out by delivering reactive gas to the substrate holder and using the reaction between the reactive gas and the accumulated film.

The substrate is preferably a substrate for information-recording disk purposes.

The substrate holder preferably comprises holding claws which engage with the circumferential edge of the substrate and a holder body to which the holding claws are fixed, and the removal is removal of the accumulated film from the surface of the holding claw.

In order to resolve the abovementioned problems, a film deposition apparatus preferably has a sputter chamber in which a film of the prescribed thickness is formed on the surface of a substrate by means of sputtering, other vacuum chambers connected directly or indirectly with the sputter chamber in such a way that the vacuum is connected, a substrate holder which holds the substrate when the film is being deposited in the sputter chamber, and a film removing mechanism which carries out the removal of the accumulated film from the surface of the substrate holder in a vacuum is established in one of the other chambers or in the sputter chamber.

In order to resolve the abovementioned problems, a film deposition apparatus preferably has a film deposition chamber in which the prescribed thin film is formed on the surface of a substrate, other vacuum chambers which are connected directly or indirectly with the film deposition chamber in such a way that the vacuum is connected, a substrate holder which holds the substrate during film deposition in the film deposition chamber and transfers the substrate between the film deposition chamber and the other chambers, and a film removing mechanism which carries out the removal of the accumulated film from the surface of the substrate holder in a vacuum is established in one of the other chambers or in the film deposition chamber.

There is preferably an auto-loader which loads the aforementioned substrates onto the aforementioned substrate holders and a control part which controls this auto-loader, and the control part executes control such that the substrate holders are not holding the aforementioned substrates when the film removing mechanism is carrying out the removal.

The film removing mechanism preferably carries out the removal by causing the accumulated film to peel away from the surface of the substrate holder by imparting heat, light or electrical energy to the accumulated film.

The removal is preferably carried out by radiating ions onto the accumulated film and the accumulated film is sputter-etched by the ion impacts.

A film removal chamber in which the aforementioned removal is preferably carried out exclusively is established. The film removal chamber is preferably connected directly or indirectly with the aforementioned sputter chamber or the aforementioned film deposition chamber in such a way that the vacuum is connected, and the film removing mechanism is established in the film removal chamber.

The sputter chamber or the film deposition chamber and the other vacuum chambers are preferably established in an airtight manner along a endless transfer path, a transfer mechanism which causes the substrate holder to move along the transfer path is established and, moreover, the film removal chamber is connected in an airtight manner with the sputter chamber or the film deposition chamber, or one of the other vacuum chambers, in such a way that it branches off the transfer path.

One of the aforementioned other vacuum chambers is preferably a load-lock chamber in which the substrates are loaded onto the substrate holders, and the film removal chamber is preferably established branching from the part of the transfer path between the load-lock chamber and the vacuum chamber for treatment purposes into which the substrate holder which has been moved from the load-lock chamber is moved initially.

The aforementioned substrate is preferably a substrate for information-recording disk purposes.

The aforementioned substrate holder preferably comprises holding claws which engage with the circumferential edge of the substrate and a holder body to which the holding claws are fixed, and the film removing mechanism is a mechanism which carries out the removal of the accumulated film from the surface of the holding claws.

In order to resolve the above-mentioned problems, a film deposition apparatus includes a load-lock chamber in which, when transferring substrates on which the film has not yet been deposited into the film deposition chamber from the atmosphere, the substrates are located temporarily, and an unload-lock chamber in which, when removing the substrates on which the film has been deposited to the atmosphere, the substrates are temporarily located. Both lock chambers are connected in a gas-tight manner while maintaining the vacuum to the film deposition chamber in which the prescribed thin film is deposited on the surface of the substrate in vacuum. A transfer mechanism transfers substrate holders on which substrates have been supported sequentially through the load-lock chamber, the film deposition chamber and the unload-lock chamber is provided. A return transfer path whereby the substrate holders from which the substrates on which a film has been deposited have been recovered in the unload-lock chamber are returned to the load-lock chamber is established, and a film removing mechanism which removes the films which have accumulated on the surfaces of the substrate holders is established in this return transfer path.

Furthermore, a film removal chamber which provides the aforementioned film removing mechanism is established in the return transfer pathway and the film removal chamber is connected in an airtight manner so that the removal of film which has accumulated on the surface of a substrate holder is carried out in a vacuum and the vacuum is connected to the unload-lock chamber and the load-lock chamber.

Furthermore, the film removing mechanism is such that the film removal is achieved by directing ions onto the accumulated film and the accumulated film is sputter etched by ion impacts.

Furthermore, the substrates are substrates for information recording disk purposes.

Furthermore, the substrate holders comprise holding claws which engage the circumferential edges of the substrates and a supporting body to which the holding claws are fixed, and the film removing mechanism removes the accumulated film on the surface of the holding claws.

DETAILED DESCRIPTION OF THE INVENTION

Embodiments of the invention are described below. In this case, as before, film deposition apparatus for use with substrates for disks for information recording purposes is considered and described as merely an example of film deposition apparatus.

Figure 1:
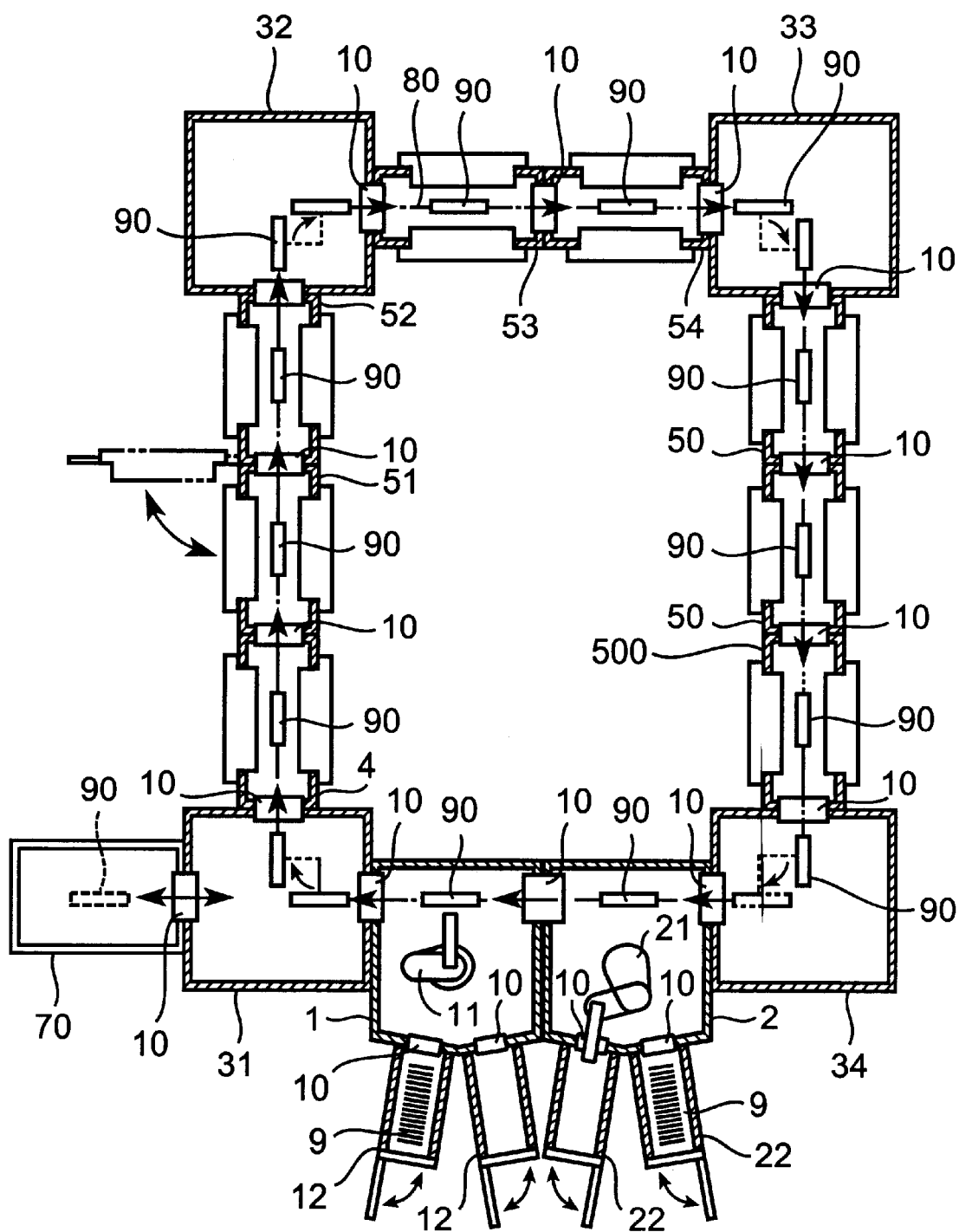
FIG. 1 is a plan view which shows the outline construction of film deposition apparatus which is an embodiment of the invention of this application.

A plan view which shows the outline construction of film deposition apparatus which is an embodiment of the invention of the present application is shown in FIG. 1. In this embodiment of the apparatus a plurality of vacuum chambers is arranged around the perimeter of a square, and the square transfer path 80 is established around the square.

Each vacuum chamber is a vacuum chamber which is pumped out by means of an exclusive or common pumping system. Gate valves 10 are established at the boundaries between the vacuum chambers. The substrates 9 are mounted on the substrate holders 90 so that they can be transferred between the chambers.

The two vacuum chambers which are located along one side of the square from among the plurality of vacuum chambers include a load-lock chamber 1 in which the substrates 9 are loaded onto the substrate holders 90 and an unload-lock chamber 2 in which the substrates 9 are recovered or removed from the substrate holders 90. Furthermore, the vacuum chambers which are arranged on the other three sides of the square are vacuum chambers in which various processes are executed. The vacuum chambers in the corners of the square are the direction switching chambers 31, 32, 33, and 34 which are furnished with direction switching mechanisms which rotate the direction in which the substrates 9 are being transferred through 90°.

Furthermore, the vacuum chambers for processing purposes into which the substrates 9 which are being held by the substrate holders 90 are transferred along the first side include a preheating chamber 4 in which the substrates 9 are preheated to a prescribed temperature prior to film deposition. The vacuum chambers into which the substrates 9 are transferred after being preheated in the preheating chamber 4 comprise the film deposition chambers 51, 52, 53, 54, and 50 in which prescribed thin films are formed on the surfaces of the substrates 9.

In the apparatus of this embodiment there is a transfer mechanism which moves the substrate holders 90 on which the substrates 9 are being held along the transfer path 80. In this embodiment, the substrates 9 are transferred in a clockwise direction and processed sequentially. The transfer mechanism is constructed principally from linear transfer mechanisms which move the substrate holders 90 linearly and the direction-switching mechanisms mentioned earlier.

Figure 2:
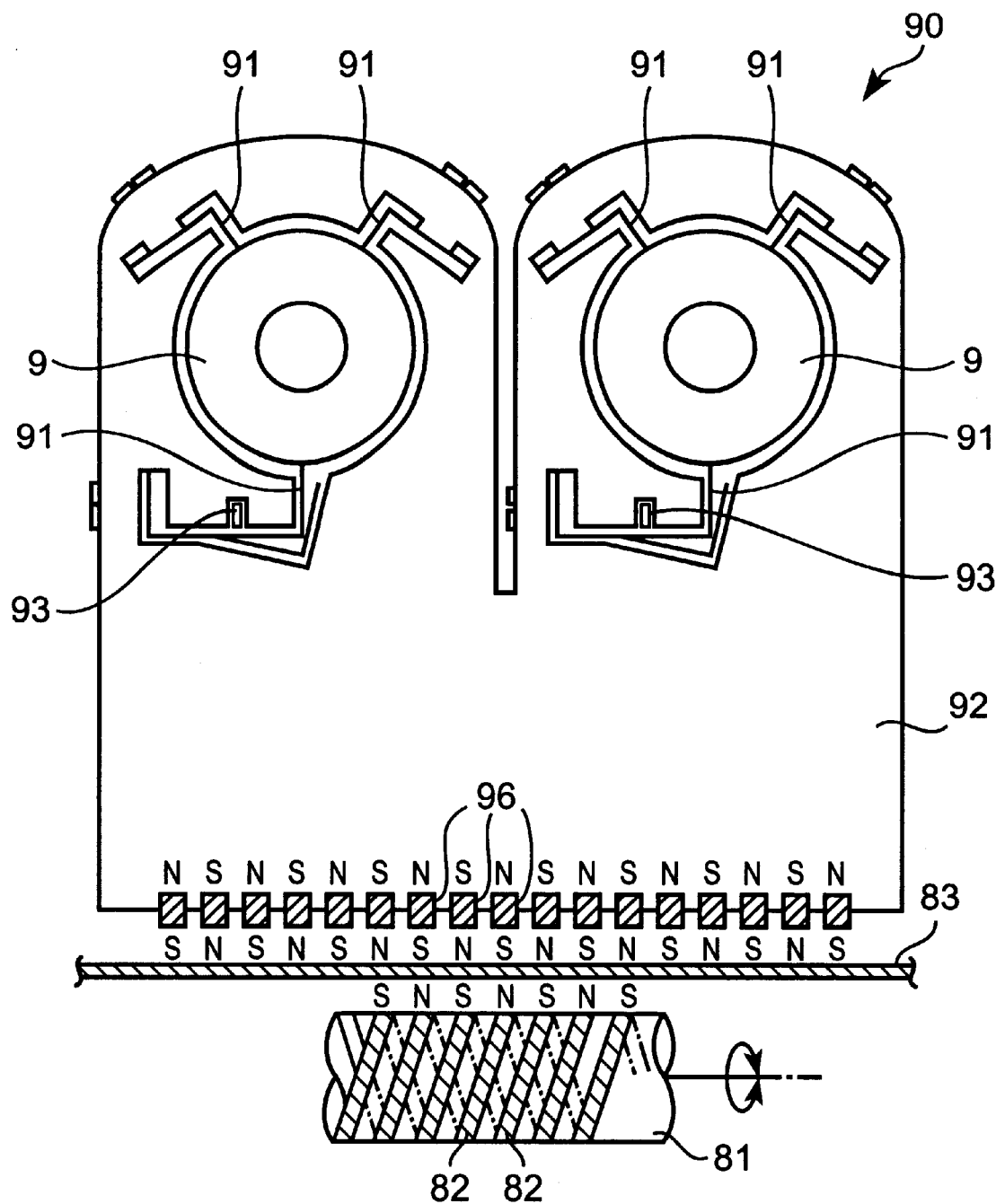
FIG. 2 is an explanatory front outline drawing of the construction of substrate holder 90 and the moving mechanism in the apparatus shown in FIG. 1.
Figure 3:
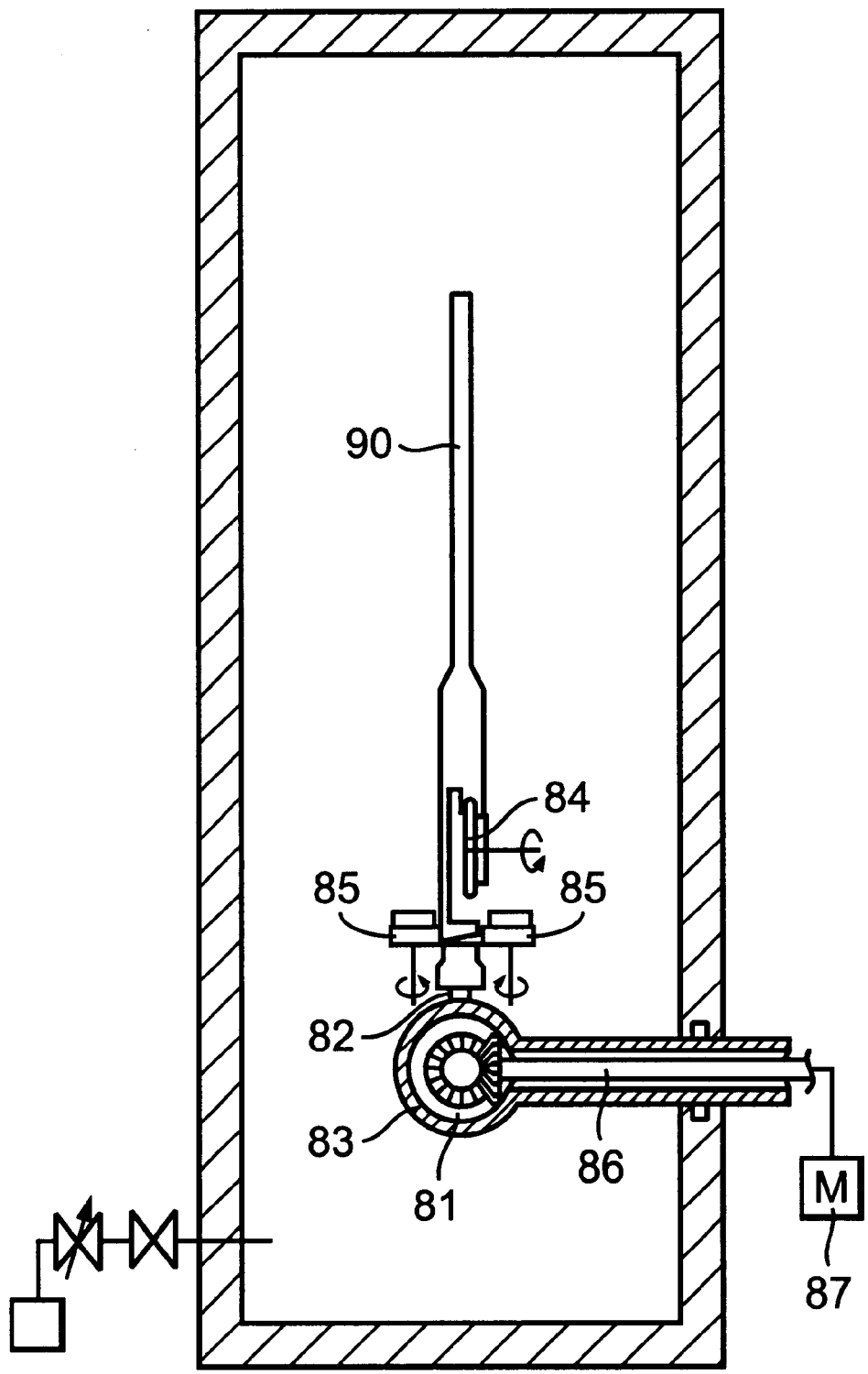
FIG. 3 is an explanatory side cross-sectional outline drawing of the construction of the substrate holder 90 and the moving mechanism in the apparatus shown in FIG. 1.

The linear transfer mechanisms which move the substrate holders 90 linearly are described below with reference to FIGS. 2 and 3. FIGS. 2 and 3 are explanatory drawings of the constructions of the substrate holders 90 and the transfer mechanism in the apparatus shown in FIG. 1, and FIG. 2 is a front outline drawing and FIG. 3 is a side cross-sectional outline drawing.

Figure 11:
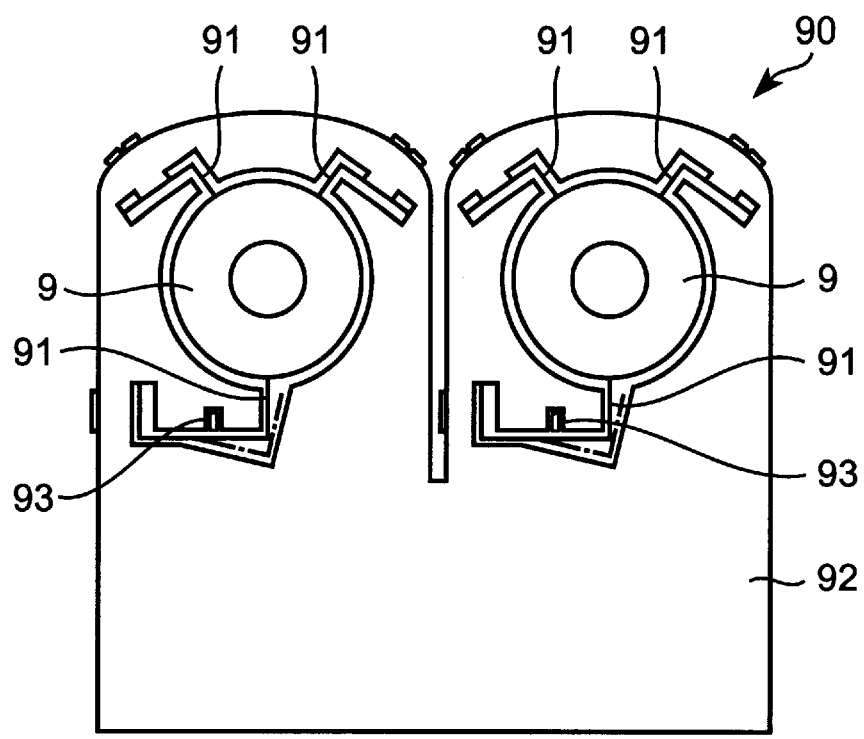
FIG. 11 is a front outline drawing which shows the construction of the substrate holder 90 shown in FIG. 10.
Figure 12:
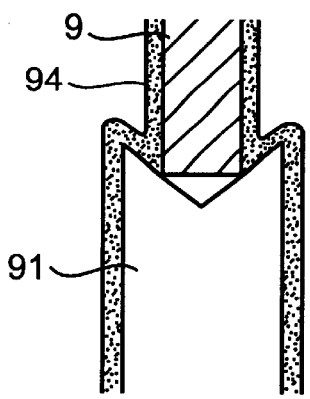
FIG. 12 is an explanatory drawing of the problems of the prior art.
Figure 12:
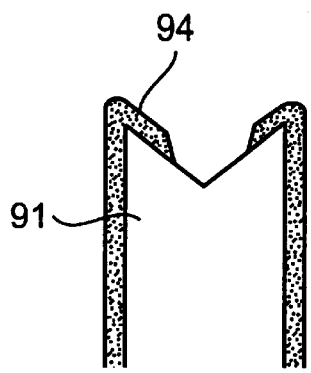
Figure 12:
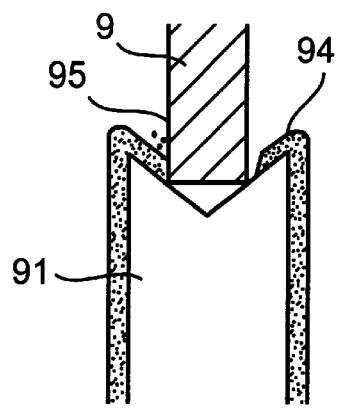

The construction of the substrate holders 90 is more or less the same as that shown in FIG. 11, and they are constructed from a holder body 92 and holding claws 91 which are established on the holder body 92. Six holding claws 91 are established in total and a single substrate 9 is held by a combination of three claws. Hence, the substrate holder 90 is such that two substrates 9 can be held at the same time.

The substrate holder 90 in this embodiment is furnished on the lower side with a plurality of small magnets (referred to hereinafter as holder-side magnets) 96, as shown in FIG. 2. The holder-side magnets 96 have their magnetic poles facing up and down. Moreover the holder-side magnets 96 have their magnetic poles reversed alternately along the row, as shown in FIG. 2.

Furthermore, a magnetic coupling roller 81 is established within a partition 83 below the substrate holder 90. The magnetic coupling roller 81 has the form of a round bar and is provided with long thin magnets 82 which are extended in the form of helixes (referred to hereinafter as the roller-side magnets), as shown in FIG. 2. There are two roller-side magnets 82 in the form of a double helix and the magnetic pole reverses alternately.

The magnetic coupling roller 81 is arranged in such a way that the roller-side magnets 82 are arranged facing the holder-side magnets 96 through the partition 83. The partition 83 is formed from a material which has a high magnetic permeability and the holder-side magnets 96 and the roller-side magnets 82 are magnetically coupled through the partition 83. Moreover, the space on the substrate holder 90 side of the partition 83 is the high vacuum side (the inside of each vacuum chamber) and the space on the magnetic coupling roller 81 side is the atmosphere side. Magnetic rollers 81 of this type are established along the square transfer path 80 shown in FIG. 1.

Furthermore, as shown in FIG. 3, the substrate holder 90 is mounted on a main pulley 84 which rotates around a horizontal rotation axis. A plurality of main pulleys 84 is established along the transfer direction of the substrate holder 90. Furthermore, a pair of sub-pulleys 85, 85 which rotate about vertical rotation axes are arranged in contact with the bottom end part of the substrate holder 90. The sub-pulleys 85, 85 press on the bottom end part of the substrate holder 90 in such a way that it is squeezed from both sides and prevent the substrate holder 90 from rotating. A plurality of sub-pulleys 85, 85 is also established along the transfer direction of the substrate holder 90.

As shown in FIG. 3, a drive rod 86 is connected via a bevel gear to the magnetic coupling roller 81. A drive motor 87 is connected to the drive rod 86 and the magnetic coupling roller 81 is caused to rotate around its central axis by the drive rod 86.

When the magnetic coupling rod 81 is rotated the double helix roller-side magnets 82 shown in FIG. 2 are also rotated. When this happens, the state of rotation of the roller-side magnets 82 as seen from the holder-side magnets 96 side is equivalent to a line comprising a plurality of small magnets with alternately different magnetic poles which is moving linearly along the direction in which the magnets are arranged. Hence, the holder-side magnets 96 which are coupled with the roller-side magnets 82 are moved linearly together with the rotation of the roller-side magnets 82 and, as a result, the substrate holder 90 is transferred linearly as a whole. At this time the main pulleys 84 and the sub-pulleys 85, 85 shown in FIG. 3 move accordingly.

Now, the principal features of the film deposition of this embodiment are the establishment of a film removing mechanism which removes the accumulated film from the surface of the substrate holder 90 in a vacuum and the establishment of a film removal chamber 70 in which this film removing mechanism is housed.

As shown in FIG. 1, the film removal chamber 70 is connected in an airtight manner to the first direction switching chamber 31 which is established between the load-lock chamber 1 and the preheating chamber 4. As is clear from FIG. 1, the film removal chamber 70 branches off the square transfer path 80 from the first direction switching chamber 31. Moreover, a gate valve 10 is established between the first direction switching chamber 31 and the film removal chamber 70.

Figure 4:
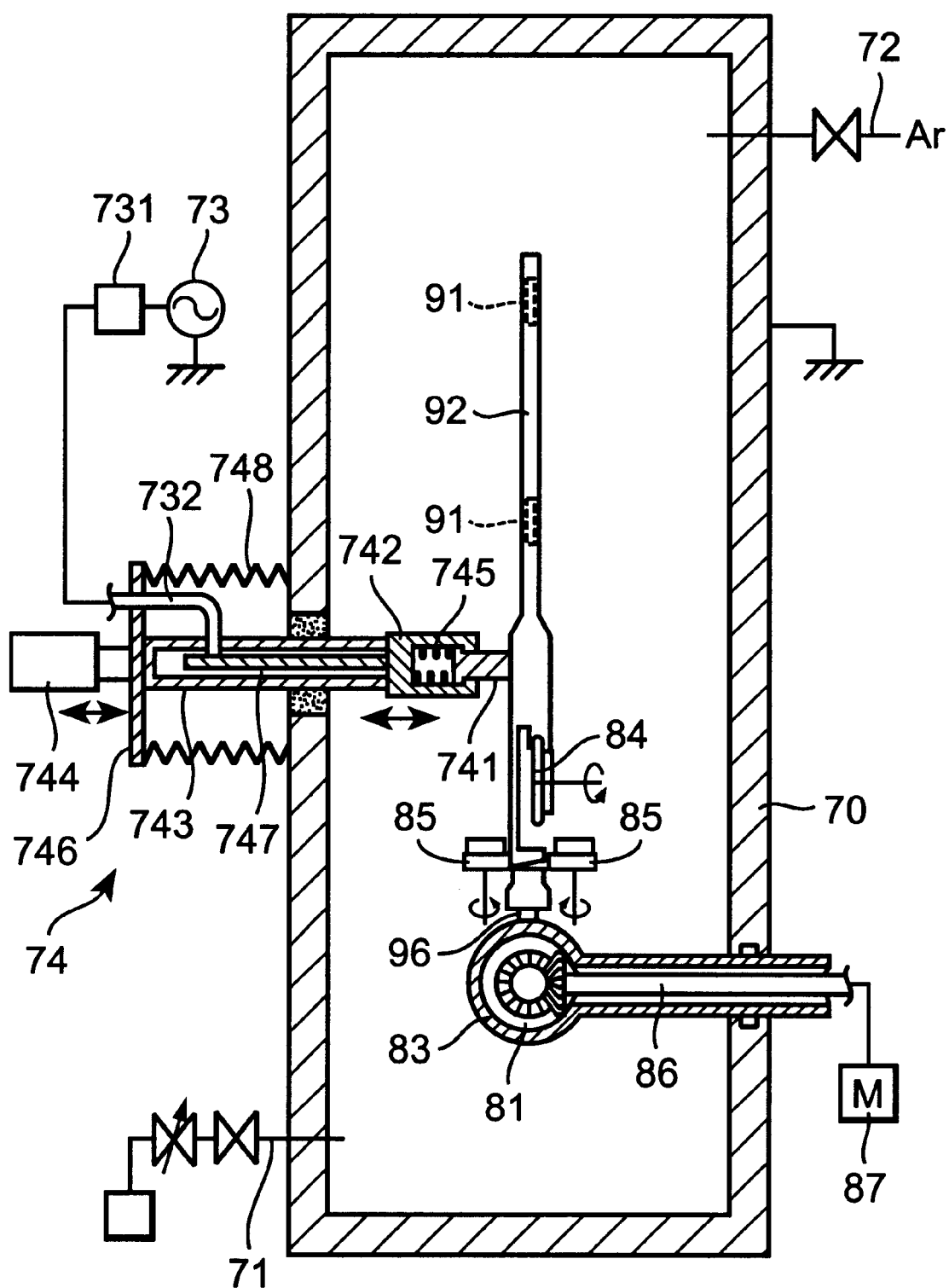
FIG. 4 is an explanatory side cross-sectional outline drawing of the construction of the film removal chamber 70 which is established in the apparatus shown in FIG. 1.

The construction of the film removal chamber 70 and the film removing mechanism are described in more detail below with reference to FIG. 4. FIG. 4 is a side cross-sectional explanatory drawing of the construction of the film removal chamber 70 which is established in the apparatus shown in FIG. 1.

The film removal chamber 70 is also an airtight vacuum chamber similar to the processing chambers mentioned above. The film removal chamber 70 has a pumping system 71. The pumping system 71 comprises a vacuum pump such as a cryopump or a turbo molecular pump and it can pump out the interior of the film removal chamber 70 down to some $10^{-8}$ Torr.

The film removing mechanism generates a high frequency discharge inside the film removal chamber 70 so that the accumulated film is removed from the surface of the substrate holder 90 by sputter etching. In practical terms, the film removing mechanism is comprised of a gas delivery system 72 which delivers a prescribed gas into the film removal chamber 70 and a high frequency power supply 73 which generates a high frequency discharge in the gas which has been delivered.

The gas delivery system 72 is provided so as to deliver a gas such as argon which is chemically inert and facilitates the generation of a discharge and which also has a high sputter rate. The gas delivery system 72 is furnished with a mass flow controller, which is not shown in the drawing, and can deliver gas at a prescribed mass flow rate.

A power supply of frequency 13.56 MHz and output some 100 W to 300 W can be used for the high frequency power supply 73. On the other hand, a movable electrode 74 is established inside the film removal chamber 70 and the connecting line 732 is established in such a way as to connect the high frequency power supply 73 and the movable electrode 74 through the matching device 731. A coaxial cable, for example, can be used for the connecting line 732.

The movable electrode 74 is comprised of an electrode rod 741, the end of which is brought into contact with the holder body 92 of the substrate holder 90, an electrode holder 742 which holds the electrode rod 741, an electrode drive rod 743 to one end of which the electrode holder 742 is connected via an insulator, and an electrode drive source 744 which is connected to the electrode drive rod 743. The electrode rod 741 is a round rod and the electrode holder 742 has a cylindrical form and the electrode rod 741 can be housed within it. The tip of the electrode rod 741 protrudes a little from the end of the electrode holder 742. Furthermore, a coil spring 745 is established inside the electrode rod holder 742 so as to be sandwiched between the rear end of the electrode rod 741 and the inner surface of the electrode rod holder 742.

Furthermore, the electrode drive rod 743 passes through a through-hole which has been established in the wall of the film removal chamber 70. The electrode drive rod 743 has a flange 746 on the part which is located on the outside (the atmosphere side) of the film removal chamber 70. A bellows 748 is established between this flange 746 and the surface of the outside wall of the film removal chamber 70. The bellows 748 prevents the vacuum from leaking from the part where the electrode drive rod 743 passes through.

Furthermore, the electrode drive rod 743 is hollow and a high frequency lead rod 747 is established with an insulating buffer material on the inside. The tip of the high frequency lead rod 747 is fixed to the electrode rod 741. An opening is then established in the part of the electrode drive rod 743 which lies within the bellows 748. The connecting line 732 which is connected to the high frequency power supply 73 is passed through the flange 746 in an airtight manner and connected to the high frequency lead rod 747 through this opening. Moreover, an air cylinder, for example, is used for the electrode drive source 744 so that the electrode drive rod 743 can be moved backward and forward with a prescribed stroke.

Operation:

The substrate holders 90 which are transferred within the film deposition chambers 51, 52, 53, 54, and 50 while holding substrates 9 and which are used for film deposition themselves accumulate a thin film on the surfaces of the holding claws 91 as described earlier. A substrate holder 90 is transferred by means of the transfer mechanism into the film removal chamber 70 when no substrate 9 is being held by it. The gate valve 10 is closed after the substrate holder 90 has been transferred into the film removal chamber 70.

The interior of the film removal chamber 70 is prepumped out to the prescribed vacuum pressure and then maintained at this pressure by means of the pumping system 71. Then, the electrode drive source 744 is operated and the electrode drive rod 743 is moved forward by just the prescribed stroke. As a result, the electrode rod 741 is also moved forward by the electrode holder 742 and comes into contact with the surface of the holder body 92 as shown in FIG. 4. At this time the coil spring 745 absorbs the impact due to the electrode rod 741 making contact with the holder body 92. Consequently, wear etc. of the electrode rode 741 can be reduced. Furthermore, the contact of the electrode rod 741 on the holder body 92 is maintained with certainty because of the spring of the coil spring 745. The high frequency power supply 73 is started in this state and a high frequency voltage is applied to the holder body 92 via the electrode rod 741, the high frequency lead rod 747 and the connecting line 732. Moreover, the holding claws 91 are also made of metal, like the holder body 92, and a high frequency voltage is also applied to the holding claws 91 via the holder body 92.

When a high frequency voltage is applied to the holder body 92 and the holding claws 91, an electric field is established between them and the wall of the film removal chamber 70 which is being maintained at ground potential and a high frequency discharge is generated in the gas which has been delivered and a high frequency discharge plasma is formed. At this time a capacitance is present between the plasma and the high frequency power supply 73 due to the presence of a condenser which is included in the matching device 731 or a separately established condenser which is not shown in the drawing. If the high frequency electric field is established via the capacitance in the space where the plasma is being formed, then the electrons and ions in the plasma will charge and discharge the condenser. As a result of this, a direct current voltage known as a self bias voltage accumulates on the surface of the holding claws 91 as a result of the difference in the mobilities of the electrons and the ions. Moreover, the surfaces of the main pulley 84 and the sub-pulleys 85 comprise insulating material and so the substrate holder 90 is insulated from the ground potential and assumes an insulated potential.

The ions in the plasma are accelerated by the self bias voltage and are directed onto the accumulated film on the surfaces of the holding claws 91 and collide with the accumulated film. By this means the accumulated film is sputter-etched and removed from the holding claws 91. The material of the accumulated film which has been removed by the sputter etching is pumped out of the film removal chamber 70 by means of the pumping system 71. The operation of the high frequency power supply 73 is stopped after the sputter etching has been carried out for a prescribed period of time.

Subsequently, the electrode drive source 744 is operated and the electrode rod 741 is pulled away from the holder body 92. Then the interior of the film removal chamber 70 is pumped out once again and then the substrate holder 90 is transferred out of the film removal chamber 70.

A more practical situation is described below. A magnetic film and a protective film are formed on the substrate 9 by depositing films on a substrate for information-recording disk purposes. Here the description is based on the assumption that the thin films also accumulate on the surface of the holding claws 91 and that these films are then removed. Moreover, the holding claws 91 are made from a material such as INCONEL®.

Argon gas is delivered by the gas delivery system 72 at a flow rate set in the range of 50 to 100 cc/min. The pumping rate controller of the pumping system 71 is adjusted and the pressure in the film removal chamber 70 is maintained in the range of 0.05 to 0.11 Torr. The high frequency power supply 73 is set to a frequency of 13.56 MHz and an output of some 200 W. A high frequency plasma is formed under such conditions and sputter etching is carried out. Under these conditions the accumulated film can be removed at an etch rate of about 4 nm/minute, and the attachment of particles to the surface of the substrate 9 which has been a problem can be suppressed satisfactorily by carrying out this operation at a frequency of once each day.

Figure 5:
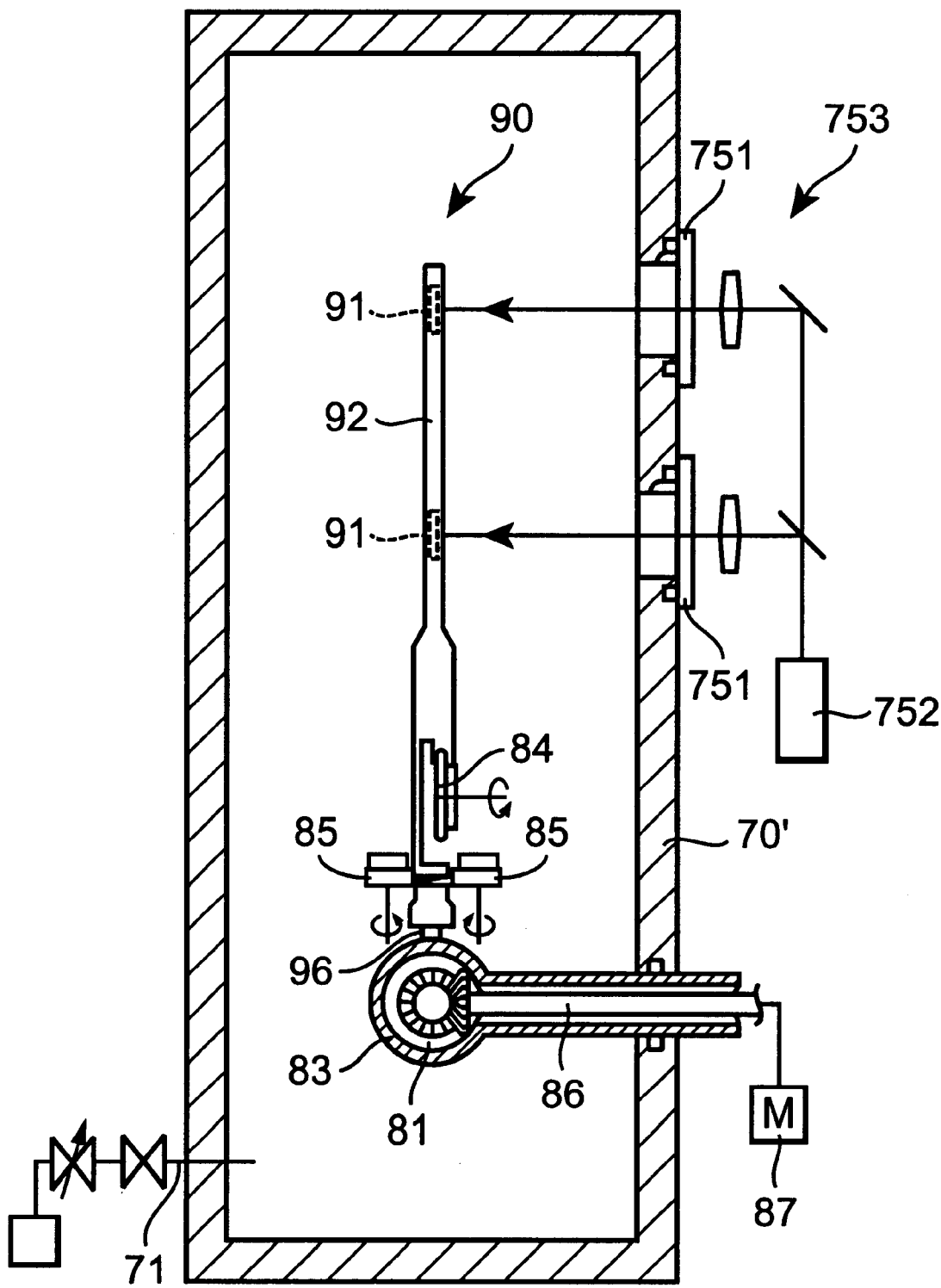
FIG. 5 is an explanatory side cross-sectional outline drawing of the construction of a different film removing mechanism.

Another embodiment for the film removing mechanism is described below. An explanatory side cross-sectional outline drawing of a different construction for the film removing mechanism is shown in FIG. 5.

The film removing mechanism in this case is such that the accumulated film is removed by radiating light onto the accumulated film on the surface of the holding claws 91. In more practical terms, light admitting windows 751 are established in an airtight manner in the wall of the film removal chamber 70'. The film removing mechanism is comprised of a light source 752 which discharges light of a prescribed wavelength and an optical system 753 which conducts the light from the light source 752 into the film removal chamber 70' in such a way that it is directed in a prescribed pattern onto each of the holding claws 91. The optical system 753 has a construction which splits the light from a light source 752 such as a laser and focuses the light with lenses in such a way that it forms a pattern which is slightly larger than the tip part of each holding claw 91.

In this case, irradiation with light is used as a means of imparting thermal energy. The accumulated film on the surface of the holding claws 91 is frequently accumulated with a large internal stress. It is thought that this is because the holding claws 91 have a complicated shape like that described earlier. When a thin film which has such a high internal stress is subjected to thermal strain, it peels off on sudden heating. Hence, if an infrared laser or an infrared lamp is used for the light source 752 and this light is focused by the optical system and directed onto the holding claws 91 then the accumulated film on the surface peels off as a result of the sudden heating.

Moreover, a case in which light energy itself is used can also be considered. For example, there are cases where the accumulated film can be peeled off from the holding claws 91 by breaking down the accumulated film by irradiation with ultraviolet light, as in the case of optical ashing, for example. In any case, the accumulated film which has been peeled off is exhausted from the film removal chamber 70' in the same way as before using the pumping system 71.

Figure 6:
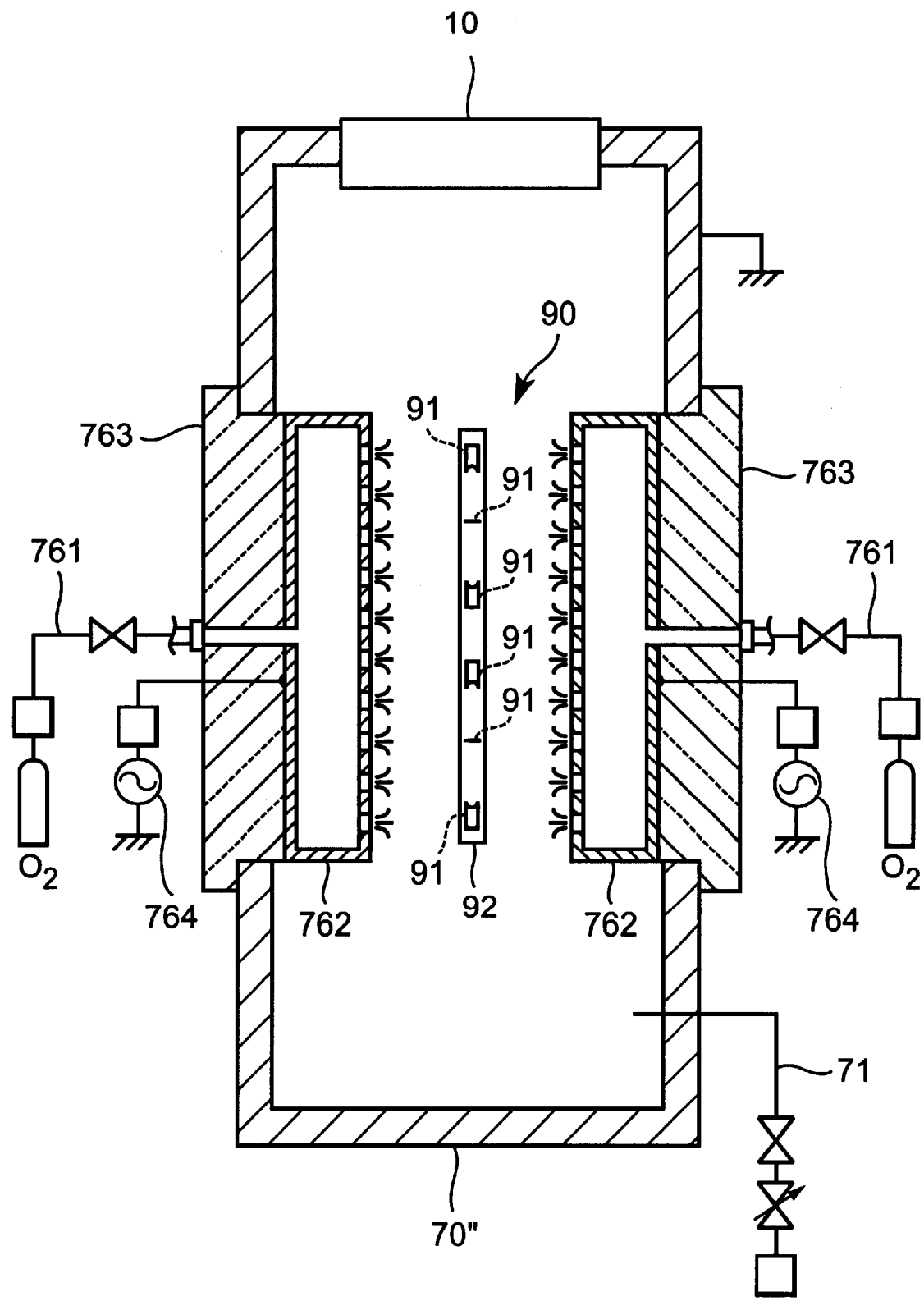
FIG. 6 is an explanatory plan cross-sectional outline drawing of the construction of yet another film removing mechanism.

Yet another example of a film removing mechanism is described below with reference to FIG. 6. An explanatory plan outline drawing of yet another example of the film removing mechanism is shown in FIG. 6. In this case the accumulated film on the surface of the holding claws 91 is removed by means of the action of a reactive gas. That is to say, the film removing mechanism is comprised of a gas delivery system 761 which delivers a reactive gas.

Oxygen, for example, can be used as the reactive gas. Thin metal based films such as thin magnetic films react (corrode) rapidly on contact with a reactive gas which has a high level of reactivity, such as oxygen, fluorine, or chlorine gas, and fall into pieces and peel off from the holding claws 91. Moreover, the holding claws 91 and the holder body 92 can be covered with a protective film so that they are not damaged chemically by such a reactive gas.

Moreover, there are cases where a thin film can be removed by simply introducing a reactive gas, but a mechanism which imparts energy to the thin film can be used in order to achieve removal in a shorter period of time. In practical terms, the construction is such that a discharge is formed within the film removal chamber 70" and the film is removed using collisions caused by the discharge. A high frequency electrode 762 is established in the film removal chamber 70". The high frequency electrode 762 is fitted to the insulating block 763 which is embedded in an airtight manner in the film removal chamber 70". The interior of the high frequency electrode 762 is hollow and a gas delivery hole is established in the front surface. The gas delivery system 761 delivers reactive gas into the film removal chamber 70 through the internal space in the high frequency electrode 762.

A high frequency power supply 764 which applies a high frequency voltage to the high frequency electrode 762 and generates a high frequency discharge is then established. The thin film which has reacted with the reactive gas is peeled away easily by the shock of the high frequency discharge. Moreover, the construction shown in FIG. 6 can also be adopted for the construction of the protective film forming chambers 50 shown in FIG. 1. If the construction is such that the gas delivery system 761 delivers a gaseous mixture of an organic compound such as $CH_4$ and hydrogen gas then a carbon protective film can be formed on the surface of the substrate 9 as a result of the degradation of the organic compound.

A construction of a film removing mechanism in which electrical energy is used can also be considered. For example, in a case where the thin film on the surface of the holding claws 91 is electrically conductive, a construction in which a large current is passed instantaneously through the thin film and the thin film is peeled off by the shock of passing the current can be considered. As mentioned earlier, the internal stress is high and so the thin film is peeled away easily by the passage of a large instantaneous current.

In this construction a pair of freely movable probes is established inside the film removal chamber. The construction is such that the tips of the probes are brought into contact with the holding claws 91, a voltage is applied across them and a current is passed through the holding claws 91.

Alternatively, another construction in which the thin film is removed by means of ultrasonic waves can be considered. For example, the construction can be such that a pair of ultrasonic oscillators are located sandwiching the holding claws 91, ultrasonic waves are applied and the thin film is caused to vibrate and peel off.

The accumulated thin films on the surfaces of the holding claws 91 can be removed in a vacuum in the film removal chamber using any of the abovementioned constructions.

The removal of accumulated film in a vacuum in this way has a technological significance such as that indicated below.

That is to say, methods in which a substrate holder 90 is taken out into the atmosphere and the accumulated film is taken off manually have been considered for removing the accumulated thin film from the surfaces of the substrate holders 90. However, when a substrate holder 90 is taken out into the atmosphere, the atmospheric oxygen, water and dust etc. become attached to the substrate holder 90 and, when the substrate holder 90 is reintroduced into the apparatus in this state, these substances are inevitably taken into the apparatus along with the substrate holder 90. As a result the surface of the substrate 9 is contaminated with oxygen etc. and there are problems in that the thin film which is being deposited may be oxidized, or in that foreign material, such as water and dust for example, may be included in the thin film.

In order to avoid such problems, the substrate holder 90 which has been taken out into the atmosphere and from which the accumulated film has been removed must be subjected to a surface cleaning process before it is reintroduced into the apparatus. Consequently a great deal of effort is required and the productivity is inevitably reduced considerably. On top of this, once the substrate holder 90 has been reintroduced, the vacuum chamber must be pumped out again and processing can only be started again after it has been confirmed that the vacuum chamber is being maintained at the prescribed pressure, and a very long period of time is required before processing can recommence. This also has the effect of greatly reducing productivity.

On the other hand, if the accumulated film is removed in a vacuum, as in the case of the method of the present embodiment, then means for cleaning the substrate holder 90 after film removal and pumping out again from atmospheric pressure are not required. Consequently there is no marked reduction in productivity.

The construction of each part of an embodiment of the film deposition apparatus is described below with reference to FIG. 1.

First of all, a mounting robot 11 is established in the load-lock chamber 1. The mounting robot 11 is constructed in such a way that substrates 9 are taken one by one from the mounting auxiliary chamber 12 by means of an arm and mounted on the substrate holder 90. Furthermore, a recovery robot 21 which has a similar construction to the mounting robot 11 is established in the unload-lock chamber 2. The recovery robot 21 is constructed in such a way that the substrates 9 are taken one by one from the substrate holder 90 by means of an arm and transferred into a recovery auxiliary chamber 22.

Figure 7:
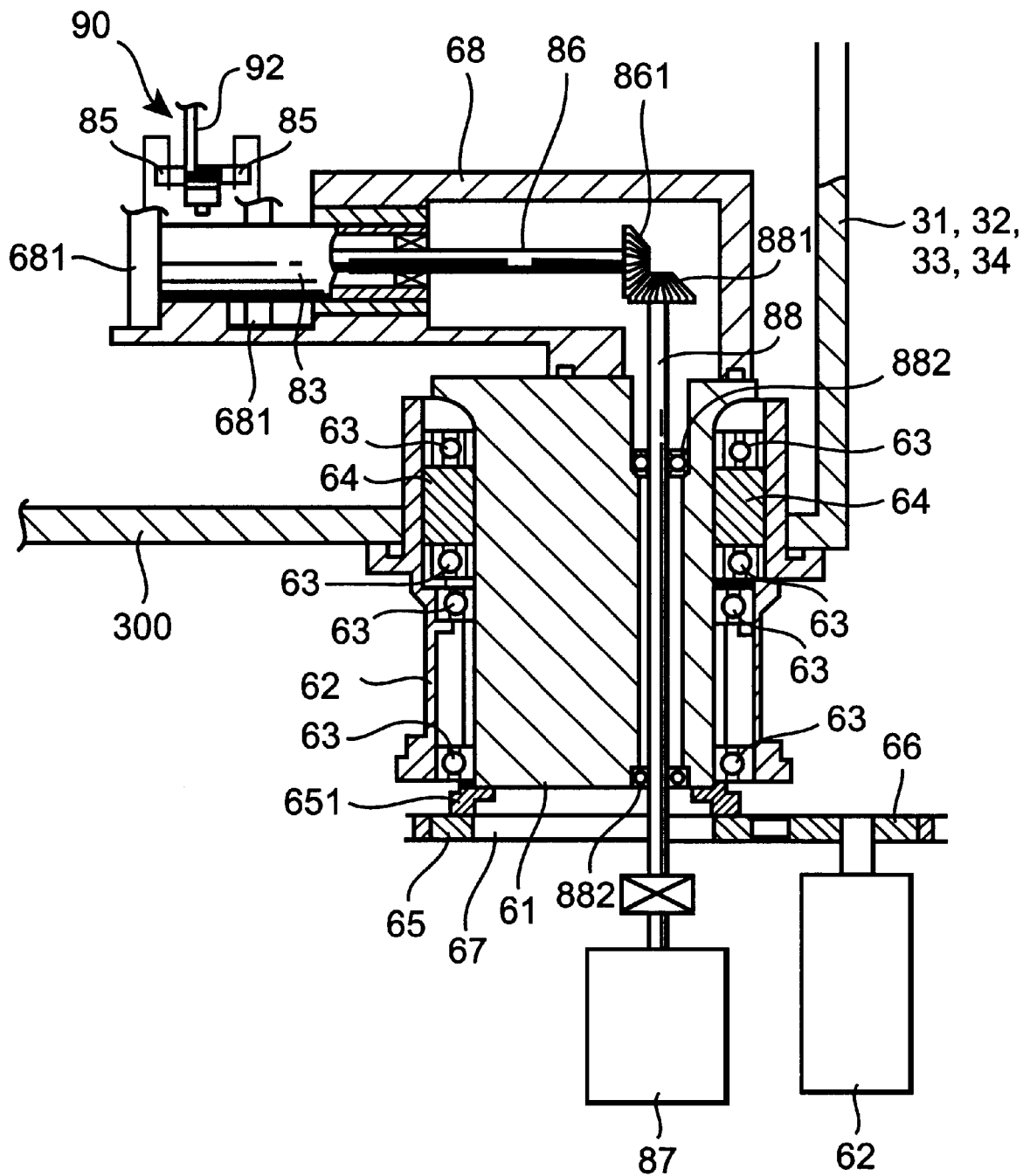
FIG. 7 is an explanatory side outline drawing of the direction switching mechanism established in the direction switching chambers 31, 32, 33 and 34 shown in FIG. 1.

The four direction switching chambers 31, 32, 33 and 34 at the corners of the square are furnished with a direction switching mechanism which is not shown in the drawing and changes the transfer direction of the substrates 9 through 90°. The direction switching mechanism is described below with reference to FIG. 7. An explanatory side outline drawing of the construction of the direction switching mechanism established in the direction switching chambers 31, 32, 33 and 34 shown in FIG. 1 is shown in FIG. 7. The direction switching mechanism shown in FIG. 7 is constructed principally from a support 61 which supports the whole of the linear transfer mechanism including a magnetic coupling roller (not shown in FIG. 7) of the same construction as described earlier and the turning motor 62 which causes the support 61 as a whole to rotate and rotates the support 61.

The drive rod 86 is connected via a motion transmitting mechanism such as a bevel gear to the shaft of the magnetic coupling roller which is not shown in FIG. 7. Another bevel gear 861 is established on the rear end of the drive rod 86, as shown in FIG. 7. A power transmission rod 88 which is arranged vertically is connected to this bevel gear 861. That is to say, a bevel gear 881 is established on the end of the power transmission rod 88 and engages with the bevel gear 861 on the rear end of the drive shaft 86. The rear end of the power transmission rod 88 is connected to the output shaft of the transfer motor 87.

The support 61 on which the direction switching mechanism is constructed is a cylindrical rod-like or cylindrical part and it is arranged with its axis in a vertical orientation. The support 61 has a long through-hole running in the vertical direction, as shown in FIG. 7, and the abovementioned power transmission rod 88 is arranged passing through this hole. A bearing 882 is arranged in the gap between the inner surface of the through-hole and the power transmission rod 88, and the power transmission rod 88 is held in the through-hole in a way which permits rotation of the power transmission rod 88.

The support 61 is arranged inside a cylindrical support cover 62 which has a slightly larger diameter. The support cover 62 is fitted to the bottom plate 300 of the direction switching chamber 31, 32, 33 or 34 in which the direction switching mechanism is arranged, with the support 61 housed inside. That is to say, the bottom plates 300 of the direction switching chambers 31, 32, 33 and 34 are provided with a circular hole of a size which matches the external diameter of the support cover 62 and the support cover 62 is inserted into and fixed in this hole. A seal, such as an O-ring for example, is established in the contact surface between the support cover 62 and the bottom plate 300.

Furthermore, the four bearings 63 arranged in line from top to bottom and the mechanical seal 64 which is established in such a way as to be between the upper two bearings 63 are established in the gap between the support cover 62 and the support 61 inside the cover. The mechanical seal 64 provides a vacuum seal in the gap between the support 61 and the support cover 62 while permitting rotation of the support 61, and a seal mechanism in which a magnetic fluid is used can be used ideally.

Furthermore, a pulley mount 651 is established on the lower surface of the support 61, and a support side pulley 65 is fixed on the bottom end of this pulley mount 651. The support side pulley 65 is arranged concentrically with the center axis of the support 61. Moreover, a motor side pulley 66 is arranged at a position which is at the same height as the support side pulley 65. The output shaft of the turning motor 62 which protrudes upward is connected to the motor side pulley 66. Furthermore, the belt 67 is established as the means of connecting the motor side pulley 66 with the support side pulley 65. In practical terms, the support side pulley 65 and the motor side pulley 66 comprise timing pulleys and the belt comprises a timing belt.

Furthermore, a supporting frame 68 is fixed in the way shown in FIG. 7 on the upper surface of the support 61. The supporting frame 68 is for supporting as a whole the substrate holder 90 and the magnetic coupling roller 81 shown in FIG. 2. A plurality of props 681 is arranged as shown in FIG. 7 on the end of the lower part of the supporting frame 68 and the aforementioned main pulley 84 and a pair of sub-pulleys 85, 85 are supported by these props 681. Then, a vacuum seal is established between the supporting frame 68 and the support 61 and leaking from inside the supporting frame 68 in the direction switching chambers 31, 32, 33 and 34 is prevented.

The operation of such a direction switching mechanism in a direction switching chamber is described below.

First of all, when the transfer motor 87 is operating, the rotation drive is transmitted to the magnetic coupling roller which is not shown in FIG. 7 via the power transmission rod 88 and the drive rod 86 and the magnetic coupling roller rotates. The substrate holder 90 above is moved linearly by this means.

When the substrate holder 90 has moved along and reached the prescribed position in the direction switching chamber 31, 32, 33 and 34, the turning motor 62 is operated. The power of the turning motor is transmitted from the motor side pulley 66 to the support side pulley 65 by means of the belt 67 and causes the support side pulley 65 to rotate. By this means, the support 61 on the top is rotated and the linear transfer mechanism which is supported on the support 61 is rotated as a whole. As a result the substrate holder 90 is also rotated. When the angle of rotation reaches 90° the turning motor 62 is stopped and the rotation of the substrate holder 90 is also stopped. By this means the direction of travel of the substrate holder 90 is turned through 90°.

Next, on receiving the prescribed control signal, the linear transfer mechanism operates again and the substrate holder 90 is moved along the transfer path 80 which has turned through 90° and the substrate holder 90 is then transferred into the next vacuum chamber. Hence, the surfaces of the substrates 9 still face sideways with respect to the transfer direction even after the transfer path 80 has changed direction.

Control of the rotation through the prescribed angle of 90°, for example, in a direction switching mechanism constructed in this way can be achieved by controlling the turning motor 62, and this can be achieved by means of a sensor mechanism which is not shown in the drawings which detects the fact that the support 61 has been rotated through the prescribed angle.

Moreover, the apparatus of this embodiment is furnished with a control part which is not shown in the drawings and controls the apparatus as a whole. The control part is such that it controls the aforementioned transfer mechanism, the mounting robot 11 and the recovery robot 21 etc.

The construction of the preheating chamber 4 is described below. The purpose of the preheating in the preheating chamber 4 is to degas, i.e., to release occluded gas from the substrates 9. If film deposition is carried out without degassing, then bubbles are formed in the film as a result of the release of occluded gas caused by the heating at the time of film deposition and there is a problem in that the surface of the film is roughened by these bubbles. For this reason the substrates 9 are preheated to a temperature of some 100 to 300° C. in the preheating chamber 4.

The preheating chamber 4 is furnished with a gas delivery system not shown in the drawings which delivers an inert gas such as nitrogen into the chamber and a heating means which heats the substrates 9 which have been introduced into the chamber. Radiant heating means such as infrared lamps, for example, are generally used for the heating means.

Figure 8:
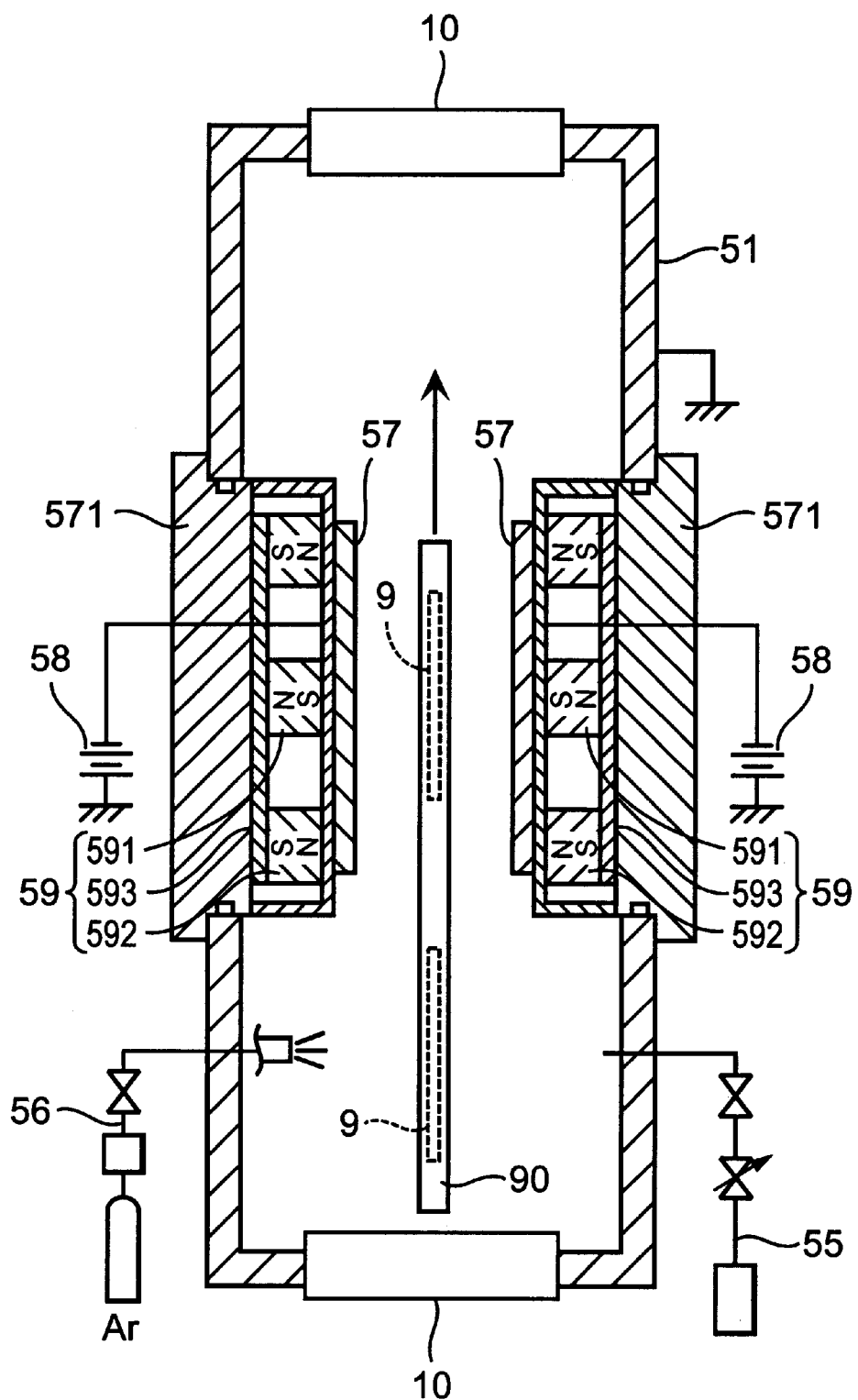
FIG. 8 is plan cross-sectional outline drawing which shows the construction of the first base film deposition chamber 51.

Each of the film deposition chambers 51, 52, 53, 54 and 50 is provided so that a prescribed thin film can be formed by means of sputtering or CVD (chemical vapor deposition). As an example, the first base film deposition chamber 51 which is the film deposition chamber into which the substrates 9 are transferred initially is described below. A plan cross-sectional outline drawing which shows the construction of the first base film deposition chamber 51 is shown in FIG. 8.

The first base film deposition chamber 51 is such that a base film is formed by sputtering. The first base film deposition chamber 51 is constructed principally from a pumping system 55 which pumps out the interior of the chamber, a gas delivery system 56 which delivers a process gas into the chamber, a target 57 which is established with the surface which is to be sputtered exposed in the space within the chamber, a sputter power supply 58 which applies a voltage for sputter discharge purposes to the target 57, and a magnet structure 59 which is established behind the target 57.

The pumping system 55 is furnished with a vacuum pump, such as a cryopump for example, and is constructed in such a way that the inside of the first base film deposition chamber can be pumped out to about $10^{-8}$ Torr. The gas delivery system 56 is constructed in such a way that a gas such as argon can be delivered at the prescribed mass flow rate as the process gas.

The sputter power supply 58 is constructed in such a way that a high negative voltage of some −300 to −500 V can be applied to the target 57. The magnet structures 59 are for achieving a magnetron discharge, and they are constructed from a central magnet 591, a ring-like circumferential magnet 592 which surrounds the central magnet 591, and a plate-like yoke 593 which connects the central magnet 591 and the circumferential magnet 592. Moreover, the target 57 and the magnet structure 59 are fixed with the insulating block 571 in the base film deposition chamber 51. The first base film deposition chamber 51 is grounded electrically.

The interior of the first base film deposition chamber 51 is maintained at the prescribed pressure by means of the pumping system 55 while delivering process gas with the gas delivery system 56 and the sputter power supply 58 is operated in this state. As a result a sputter discharge is produced and the target 57 is sputtered, and the material of the sputtered target 57 reaches the substrates 9 and the prescribed base film is deposited on the surfaces of the substrates 9. Moreover, as is clear from FIG. 8, a combination of target 57, magnet structure 59 and sputter power supply 58 is established on both sides, sandwiching the location where the substrate 9 is located in the first base film deposition chamber 51, so that a base film can be deposited on both sides of the substrate 9 at the same time.

Furthermore, as shown in FIG. 8, the size of each target 57 is slightly greater than the size of a single substrate 9. This is because the substrate holder 90 in which two substrates 9 are held is transferred into the first base film deposition chamber 51 and the two substrates 9 are located in front of the targets 57 sequentially. That is to say, initially the substrate 9 at the front end in the transfer direction is brought in front of the targets 57 and film deposition is carried out on this substrate 9. Then the system is advanced by the prescribed distance and the substrate 9 at the back end in the transfer direction is moved into the position in front of the targets 57 and film deposition of this substrate 9 is carried out in this state.

More practical examples of the constructions of the film deposition chambers 51, 52, 53, 54 and 50 are described below in the order in which the substrates 9 are transferred. The first base film deposition chamber 51 deposits a Cr film as a base film. Furthermore, the film deposition chamber into which the substrate 9 is transferred following the first base film deposition chamber 51 is a first magnetic film deposition chamber 52 in which a magnetic film is deposited by sputtering. In this embodiment a CoCrTa film is deposited as the magnetic film.

The apparatus of this embodiment is such that the base film and the magnetic film are formed as two layers. That is to say, the film deposition chamber into which the substrates 9 are transferred after the first magnetic film deposition chamber 52 is a second base film deposition chamber 53 and the film deposition chamber into which the substrates 9 are transferred next is a second magnetic film deposition chamber 54. The second base film deposition chamber 53 is a chamber in which a Cr film is formed as a base film in the same way as in the first base film deposition chamber 51, and similarly the second magnetic film deposition chamber 54 is a chamber in which as CoCrTa film is formed as a magnetic film.

Then, the film depositing chamber into which the substrates 9 are transferred after the second magnetic film depositing chamber 54 is a protective film deposition chamber 50 in which carbon protective film is deposited by means of CVD. Two protective film deposition chambers 50 are provided. A protective film of about half the required thickness is deposited in the protective film deposition chamber 50 into which the substrates 9 are transferred initially and the remaining half of the thickness of the protective film is deposited in the next protective film deposition chamber 50.

The protective film deposition chambers 50 are furnished with a process gas delivery system not shown in the drawings which delivers an organic compound gas, such as CH4 for example, and a plasma generating means not shown in the drawings which imparts high frequency energy to the process gas and generates plasma. The organic compound gas is broken down in the plasma and a thin film of carbon accumulates on the surface of the substrate 9.

Furthermore, the vacuum chamber into which the substrates 9 are transferred after the protective film deposition chambers 50 is a spare chamber 500. The spare chamber 500 provides a chamber in which the substrates 9 can cool down, if required. On leaving the spare chamber 500 the substrates 9 pass through the last direction switching chamber 34 and reach the unload-lock chamber 2.

The operation of the apparatus of this embodiment of the abovementioned construction is described below.

The apparatus of this embodiment in the normal operating state generally has a substrate holder 90 located in each of the vacuum chambers except the film removal chamber 70. Then, with timing which is determined by the operating time in the vacuum chamber in which the longest operation is being carried out (the rate determining chamber), the substrate holders 90 in each vacuum chamber are all moved along at the same time into the next vacuum chamber.

On looking at the movements of a specified substrate 9, the substrate 9 is mounted on the substrate holder 90 in the load-lock chamber 1 and is then preheated in the preheating chamber 4. Next two-layer base films and magnetic films are deposited by means of the first base film deposition chamber 51, the first magnetic film deposition chamber 52, the second base film deposition chamber 53 and the second magnetic film deposition chamber 54. Then a protective film is deposited in the protective film deposition chambers 50 and the substrate 9 reaches the unload-lock chamber 2 via the spare chamber 500. The substrate is then recovered from the substrate holder 90 in the unload-lock chamber 2.

The substrate holder 90 passes around the square transfer path 80 shown in FIG. 1 and is used time after time for the treatment of substrates 9 in the way described above.

Then, after being used for a prescribed number of film deposition processes, a substrate holder 90 is transferred into the film removal chamber 70 with no substrates 9 mounted on it. That is to say, when the control part which is not shown in the drawing determines that the accumulated film must be removed from a specified substrate holder 90, a control signal is sent to the mounting robot 11 which is then controlled in such a way that no substrate 9 is mounted. Then, this substrate holder 90 is transferred through the gate valve 10 without being switched in direction in the first direction switching chamber 31 and the substrate holder 90 enters the film removal chamber 70. The accumulated film is then removed from the surface of the holding claws 91 in the way described earlier in the film removal chamber 70.

The time which is required to remove the accumulated film in the film removal chamber 70 is often longer than the aforementioned step timing. The removal of the accumulated film is therefore carried out with the substrate holder 90 located in the film removal chamber 70 for a number of timing steps. During this time the other substrate holders 90 are being transferred into the next vacuum chamber in each case in the way described above at each timing step and operation is carried out. Hence the state where the substrate holder 90 is located in the film removal chamber 90 is a so-called "missing tooth" state. All of the substrate holders 90 are transferred at the same time into the next vacuum chamber after each timing interval in this "missing tooth" state.

Then, when the removal of the accumulated film has been completed in the film removal chamber 70, the control part executes control such that this substrate holder 90 is returned to the square transfer path 80. For example, when all of the substrate holders 90 have almost made a circuit of the square transfer part 80 and the "missing tooth" position reaches the load-lock chamber 1 once again, the control part controls the mounting robot 11 in such a way that no mounting operation is carried out. Then, at the next transfer, the control part controls the transfer mechanism in such a way that the substrate holder 90 which is in the film removal chamber 70 is transferred through the first direction switching chamber 31 into the preheating chamber 4. As a result, a substrate holder 90 is located in each of the vacuum chambers except the film removal chamber 70 and the operation is repeated in the same way as before.

Furthermore, in those cases where the substrate holder 90 is to be returned from the film removal chamber 70 before the "missing tooth" part has made a complete circuit, the control part executes control which shifts the "missing tooth" part. That is to say, at some point in time the control part moves the substrate holders 90 located in the vacuum chambers from the preheating chamber up to the vacuum chamber before the one which forms the "missing tooth" into the chambers one in front at the same time. As a result, the preheating chamber 4 assumes the state of the "missing tooth". Subsequently, processing is carried out as described before in the various vacuum chambers into which the substrate holders have been transferred and the preheating chamber 4. During this step no processing is carried out in the other vacuum chambers and they adopt a standby state. Then, in the next step, all of the substrate holders 90 are transferred at the same time and operation is carried out in the same way as before.

The construction in which the film removal chamber 70 forms a branch on the square transfer path 80 as described above means that the time for film removal can be set irrespective of the step timing in the other vacuum chambers. However, if the film removal chamber 70 is one of the vacuum chambers along the square transfer path 80 then the processing time in the film removal chamber 70 is controlled by the step timing. If the time required to remove the film is the longest time then this becomes the step time. As a result, the step timing is increased and productivity falls and the other vacuum chambers are put on a stand-by state until film removal in the film removal chamber has been completed, and this results in time being wasted.

However, if the film removal chamber 70 is established as a branch from the transfer path 80 then the film removal time can be set independently of the step timing and the fall in productivity and the occurrence of wasted time are suppressed. Moreover, in those cases where the time required for film removal in the film removal chamber 70 is shorter than the step time the film removal chamber 70 may be set into the square transfer part 80. For example, it could be located between the unload-lock chamber 2 and the load-lock chamber 1. Moreover, the film removal chamber 70 may be connected directly to the film deposition chambers 51, 52, 43, 54 in which film deposition is carried out by sputtering.

Furthermore, a construction in which the film removal chamber 70 is established branching from the site of the first direction switching chamber 31 is ideal from the viewpoint of the reproducibility of film deposition. As is clear for the description given above, the substrate holder 90 with which film removal has been completed passes once almost right round the square transfer part 80 in the empty state (holding no substrates 9) and then the film deposition processes are carried out on the next circuit.

If the construction is such that the film removal chamber 70 is branched from the direction switching chamber 34 (referred to hereinafter as the fourth direction switching chamber) between the spare chamber 36 and the unload-lock chamber 2 and the substrate holder 90 from which the film has been removed in the film removal chamber 70 is loaded with substrates 9 immediately after passing through the unload-lock chamber then the substrate holder 90 will hold the substrates 9 in a somewhat different state than that of the other substrate holders 90.

In this case it is the temperature which presents the greatest problem. Since it has not passed through the preheating chamber 4, the substrate holder 90 holds the substrates 9 in a state where the temperature is lower than that of the other substrate holders 90. Although the substrates 9 which are being held by this substrate holder 90 are preheated in the preheating chamber 4 and the temperature is raised, the temperature of the substrate holder 90 is low and so heat is lost to the substrate holder 90 and, even if they have been heated under the prescribed conditions, the substrates 9 do not reach the intended temperature. When such substrates are sent through the film deposition chambers 51, 52, 53 and 54 and films are deposited the reproducibility is reduced and the film deposition rate is reduced in many cases because the film forming process is dependent on temperature, and there is a problem in that the film quality deteriorates.

The heating conditions in the preheating chamber 4 should be changed for just these substrates in order to resolve this problem. However, rapid heating to the same temperature as the other substrate 9 within the step time is difficult in practice.

Furthermore, another method involves transferring the substrate holder 90 from the fourth direction switching chamber 34 around the circuit without holding substrates 9 and then loading with substrates 9 in the load-lock chamber 1 after it has passed through the unload-lock chamber 2 again. However, with this method the distance transferred in the empty state is longer by just the unload-lock chamber 2 and load-lock chamber parts when compared with the method mentioned earlier and there is a deterioration in productivity. In view of these points the film removal chamber 70 is preferably branched off from the position of the first direction switching chamber 31. That is to say, more generally, it is branched off from between the vacuum chamber for processing purposes into which the substrate holders 90 which have been transferred out of the load-lock chamber 1 are transferred initially and the load-lock chamber 1.

Moreover, the apparatus of this embodiment is such that film deposition is carried out as the substrate holders 90 are being circulated in a vacuum, as described above, and so no atmospheric oxygen, water or dust etc. is carried into the apparatus by way of the substrate holders 90. Consequently, contamination of the surfaces of the substrate 9 is reduced. Furthermore, if the substrate holders 90 where a thin film has accumulated on the surface are taken out to the atmosphere side then the surface of the thin film may be oxidized and foreign material may be attached. Then, when the next substrates 9 are being held and thin films are being deposited a further thin film will accumulate on the thin film where the surface has been oxidized or where foreign material has been attached in this way. When such thin films which have different properties are laminated one on another the stress level is higher and peeling is more likely to occur. Hence, the risk of forming the abovementioned particles is increased. However, the film deposition apparatus of this embodiment does not give rise to any such problem since the substrate holders 90 are not taken out into the atmosphere.

In the embodiments described above, the description has focused principally on the removal of the accumulated film from the surfaces of the holding claws 91, but the accumulated film can also be removed from the surface of the holder bodies 92 in the same way, and the number of particles released from the surfaces of the holder bodies 92 can also be reduced.

Furthermore, in the abovementioned embodiments an exclusive film removal chamber 70 which is furnished with a film removing mechanism has been provided, but the construction may be such that the film removing mechanism is provided in another vacuum chamber and no exclusive film removal chamber 70 is provided. For example, the film removing mechanism may be established in the first direction switching chamber 31.

Moreover, the film removing mechanism may be established in the film deposition chambers 51, 52, 53, 54 and 50. For example, the protective film deposition chambers 50 are furnished with a high frequency power supply for CVD purposes and so if provision is made for the introduction of argon gas by the gas delivery system of the protective film deposition chambers 50 then film removal could be achieved in the protective film deposition chambers 50. Furthermore, film removal is also possible in the film deposition chambers 51, 52, 53 and 54 in which sputtering is carried out if movable electrodes 74 are established and a high frequency voltage is applied to the substrate holders 90. At this time the targets 57 should be maintained at the ground potential and the targets 57 should also be covered with a shutter which is at ground potential so that the targets 57 are not subjected to sputter etching.

In the description above the substrate holders 90 have been holders where the circumferential edges of the substrates 9 are held by the holding claws 91, but with substrates which has a circular hole in the center, such as the substrates used for information-recording disks, the edge of the central hole may be engaged. However, with a construction in which the holding claws are engaged on the edge of a central hole it is impossible in view of the structure on which the holding claws are established to deposit films on both sides of the substrate at the same time. Furthermore, most recently very small information-recording disks such as the hard disks for use in notebook computers have come to the fore and it is difficult to engage such miniature substrates using the edge of the central hole. Hence, the construction which engages the circumferential edge of the substrate 9 has the advantages of enabling film deposition to be carried out on both sides simultaneously and of being equally effective with miniature substrates.

Figure 9:
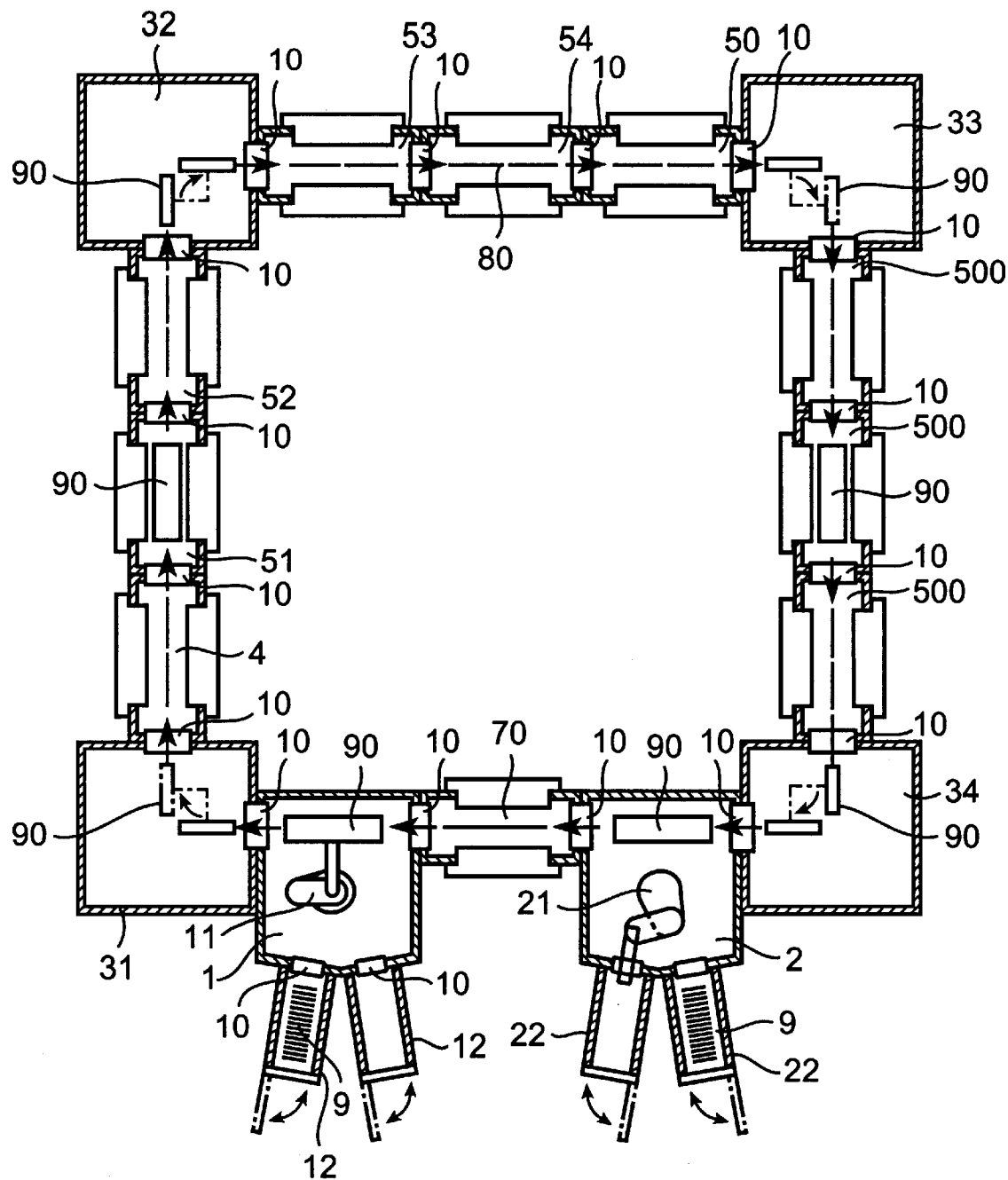
FIG. 9 is a plan view which shows the outline construction of film deposition apparatus which is an alternative embodiment of the invention of this application.
Figure 10:
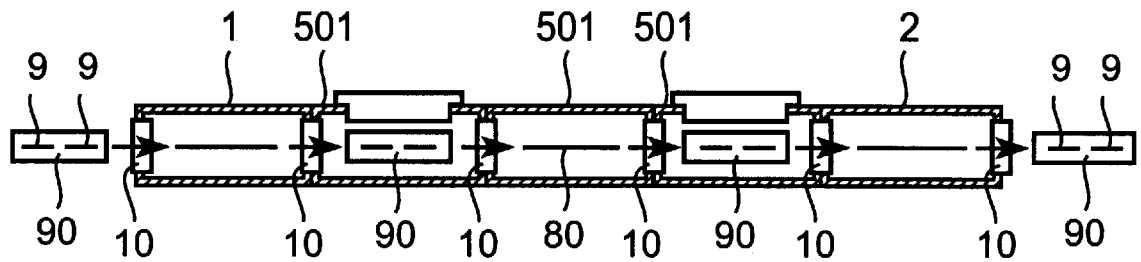
FIG. 10 is a plan view which shows the outline construction of a conventional film deposition apparatus for substrate for information-recording disks.

Turning attention to FIG. 9, another embodiment of the present invention is disclosed. Unless otherwise described below, the details of the FIG. 9 embodiment are the same as the FIG. 1 embodiment, and reference numerals used in FIG. 1 that are also used in FIG. 9 are used to describe the same or similar structure.

In this embodiment of the apparatus a plurality of vacuum chambers is arranged around the perimeter of a square. Each vacuum chamber is a vacuum chamber which is pumped out by means of an exclusive or common pumping system. Gate valves 10 are established at the boundaries between the vacuum chambers. The substrates 9 are mounted and transferred on the substrate holders 90. A square transfer path 80 is established following the plurality of vacuum chambers which are established, and a transfer mechanism which transfers the substrate holders 90 along this transfer path 80 is established. Thus the substrate holders 90 can be transferred while holding the substrates 9 during their transfer by means of the transfer mechanism.

The two of the vacuum chambers which are located along one side of the square from among the plurality of vacuum chambers provide a load-lock chamber 1 in which the substrates 9 are loaded onto the substrate holders 90 and an unload-lock chamber 2 in which the substrates 9 are recovered from the substrate holders 90. Moreover, a return transfer path whereby the substrate holders 90 are returned from the unload-lock chamber 2 to the load-lock chamber 1 is formed in the part between the load-lock chamber 1 and the unload-lock chamber 2 within the square transfer path 80.

Furthermore, the vacuum chambers which are arranged on the other three sides of the square are vacuum chambers in which various processes are executed. The vacuum chambers in the corners of the square are direction switching chambers 31, 32, 33 and 34 which are furnished with direction switching mechanisms which rotate the direction in which the substrates 9 are being transferred through 90°.

Furthermore, the vacuum chamber for processing purposes into which the substrates 9 which are being held by the substrate holders 90 are transferred initially comprises a pre-heating chamber 4 in which the substrates 9 are pre-heated to a prescribed temperature prior to film deposition. The vacuum chambers into which the substrates 9 are transferred after being pre-heated in the pre-heating chamber 4 comprise the film deposition chambers 51, 52, 53, 54 and 50 in which prescribed thin films are formed on the surfaces of the substrates 9.

In the apparatus of this embodiment, a transfer mechanism moves the substrate holders 90 on which the substrates 9 are being held in a clockwise direction along the transfer part 80 so that the processes can be carried sequentially. The transfer mechanism is constructed principally from linear transfer mechanisms which move the substrate holders 90 linearly and the direction-switching mechanisms mentioned earlier.

The linear transfer mechanisms which move the substrate holders 90 linearly are described below with reference to FIGS. 2 and 3. FIGS. 2 and 3 are explanatory drawings of the constructions of the substrate holders 90 and the transfer mechanism in the apparatus shown in FIG. 9, and FIG. 2 is a front outline drawing and FIG. 3 is a side cross sectional outline drawing.

The construction of the substrate holders 90 is more or less the same as that shown in FIG. 11, and which is described in detail, hereinabove.

Now, the principal features of the film deposition of this embodiment are the establishment of a film removing mechanism which removes the accumulated film from the surface of the substrate holder 90 in a vacuum, and the establishment of a film removal chamber 70 in which this film removing mechanism is housed. As shown in FIG. 9, the film removal chamber 70 is established between the load-lock chamber 1 and the unload-lock chamber 2.

The film removal chamber 70 is a vacuum chamber which is furnished with a pumping system (not shown in FIG. 9). This film removal chamber 70 is connected in an airtight manner so that the vacuum is connected to the load-lock chamber 1 and the unload-lock chamber 2. Gate valves 10 are established respectively between the load-lock chamber 1 and the film removal chamber and between the film removal chamber and the unload-lock chamber 2.

The construction of the film removal chamber 70 and the film removing mechanism are described in more detail above with reference to FIG. 4.

The operation of the film removal chamber 70 which is constructed in this way and the film removing mechanism are described below.

The substrate holders 90 which are transferred within the film deposition chambers 51, 52, 53, 54 and 50 while holding substrates 9 and which are used for film deposition themselves accumulate a thin film on the surfaces of the holding claws 91 as described earlier. The substrates 9 on which films have been deposited are recovered from the substrate holder 90 in the unload-lock chamber 2 and the substrate holder 90 is transferred by means of the transfer mechanism in a state where no substrate 9 is being held into the film removal chamber 70. The gate valve 10 is closed after the substrate holder 90 has been transferred into the film removal chamber 70.

The interior of the film removal chamber 70 is pre-pumped out to the prescribed vacuum pressure and then maintained at this pressure by means of the pumping system 71. Then, the electrode drive source 744 is operated and the electrode drive rod 743 is moved forward by just the prescribed stroke. As a result, the electrode rod 741 is also moved forward by the electrode holder 742 and comes into contact with the side surface of the holder body 92 as shown in FIG. 4. At this time the coil spring 745 absorbs the impact due to the electrode rod 741 making contact with the holder body 92. Consequently, wear of the electrode rod 741 is suppressed. Furthermore, the contact of the electrode rod 741 on the holder body 92 is maintained with certainty because of the elasticity of the coil spring 745. The high frequency power supply 73 is started in this state and a high frequency voltage is applied to the holder body 92 via the electrode rod 741, the high frequency lead rod 747 and the connecting line 732. Moreover, the holding claws 91 are also made of metal, like the holder body 92, and a high frequency voltage is also applied to the holding claws 91 via the holder body 92.

When a high frequency voltage is applied to the holder body 92 and the holding claws 91 an electric field is established between them and the wall of the film removal chamber 70 which is being maintained at ground potential, and a high frequency discharge is generated in the gas which has been delivered and a high frequency discharge plasma is formed. At this time a capacitance is present between the plasma and the high frequency power supply 73 due to the presence of a condenser which is included in the matching device 731 or a separately established condenser which is not shown in the drawing. If the high frequency electric field is established via the capacitance in the space where the plasma is being formed then the electrons and ions in the plasma will charge and discharge the condenser. As a result of this a direct current voltage known as a self-bias voltage accumulates on the surface of the holding claws 91 as a result of the difference in the mobilities of the electrons and the ions. Moreover, the surfaces of the main pulley 84 and the sub-pulleys 85, 85 comprise insulating material and so the substrate holder 90 is insulated from the ground potential and assumes an insulated potential.

The ions in the plasma are accelerated by the self-bias voltage and are directed onto the accumulated film on the surfaces of the holding claws 91 and collide with the accumulated film. By this means the accumulated film is sputter etched and removed from the holding claws 91. The operation of the high frequency power supply is stopped after sputter etching for the prescribed period of time. Subsequently, the electrode drive source 744 is operated and the electrode rod 741 is pulled away from the holder body 92. Then the interior of the film removal chamber 70 is pumped out once again and then the substrate holder 90 is transferred out of the film removal chamber 70. Moreover, a collecting plate not shown in the drawing on which the particles of the accumulated film which have been released by the etching are attached and collected is established in the film removal chamber 70. When the amount of material collected on this collecting plate reaches a certain level, the film removal chamber 70 is opened and returned to atmospheric pressure and the collecting plate is replaced.

As an alternative to the film removing mechanism described above with regard to FIG. 4, a film removing mechanism such as that disclosed in FIG. 5 and described above may be used.

Yet another example of a film removing mechanism is described above with reference to FIG. 6.

A construction of a film removing mechanism in which electrical energy is used, as described above, can also be used.

Alternatively, another construction in which the thin film is removed by means of ultrasonic waves can be considered. For example, the construction can be such that a pair of ultrasonic oscillators are located sandwiching the holding claws 91, ultrasonic waves are applied and the thin film is caused to vibrate and peel off.

The accumulated thin films on the surfaces of the holding claws 91 can be removed in a vacuum in the film removal chamber 70 using any of the above-mentioned constructions. The removal of accumulated film in a vacuum in this way has a technological significance such as that indicated below.

That is to say, methods in which a substrate holder 90 is taken out into the atmosphere and the accumulated film is taken off manually have been considered for removing the accumulated thin film from the surfaces of the substrate holders 90. However, when a substrate holder 90 is taken out into the atmosphere the atmospheric oxygen, water and dust etc. become attached to the substrate holder and, when the substrate holder is reintroduced into the apparatus in this state these substances are inevitably taken into the apparatus along with the substrate holder 90. As a result the surface of the substrate 9 is contaminated with oxides etc. and there are problems in that the thin film which is being deposited may be oxidized, or in that foreign material, such as water and dust for example, may be included in the thin film.

In order to avoid such problems, the substrate holder 90 which has been taken out into the atmosphere and from which the accumulated film has been removed must be subjected to a surface cleaning process before it is reintroduced into the apparatus. Consequently a great deal of effort is required and the productivity is inevitably reduced considerably. On top of this, once the substrate holder 90 has been reintroduced, the vacuum chamber must be pumped out again and processing can only be started again after it has been confirmed that the vacuum chamber is being maintained at the prescribed pressure, and a very long period of time is required before processing can recommence. This also has the effect of greatly reducing productivity.

On the other hand, if the accumulated film is removed in a vacuum, as in the case of the method of the present embodiment, then means for cleaning the substrate holder 90 after film removal and pumping out again from atmospheric pressure are not required. Consequently there is no marked reduction in productivity.

With reference to FIG. 9, a mounting robot 11 is established in the load-lock chamber 1. The mounting robot 11 is constructed in such a way that substrates 9 are taken one by one from the mounting auxiliary chamber 12 by means of an arm and mounted on the substrate holder 90. Furthermore, a recovery robot 21 which has a similar construction to the mounting robot 11 is established in the unload-lock chamber 2. The recovery robot 21 is constructed in such a way that the substrates 9 are taken one by one from the substrate holder 90 by means of an arm and transferred into a recovery auxiliary chamber 22.

The four direction switching chambers 31, 32, 33, and 34 at the corners of the square are furnished with a direction switching mechanism not shown in the drawing which changes the transfer direction of the substrates 9 through 90°. The direction switching mechanism is described above with reference to FIG. 7.

Moreover, the apparatus of this embodiment is furnished with a control part not shown in the drawings which controls the apparatus as a whole. The control part is such that it controls the aforementioned transfer mechanism, the mounting robot 11 and the recovery robot 21 etc.

The construction of the pre-heating chamber 4 is described above, and each of the film deposition chambers 51, 52, 53, 54 and 50 is provided, as also described above.

The overall operation of the apparatus of this embodiment of the above-mentioned construction is described below.

A substrate holder 90 is normally located in each of the vacuum chambers in the apparatus of this embodiment. Then, with step timing which is determined by the operating time in the vacuum chamber in which the longest operation is being carried out (the rate determining chamber), the substrate holders 90 in each vacuum chamber are all moved along into the next vacuum chamber at the same time.

On looking at the movement of a specified substrate 9, the substrate 9 is mounted on the substrate holder 90 in the load-lock chamber 1 and then preheated in the preheating chamber 4. Next two base films and magnetic film layers are deposited by means of the first base film deposition chamber 51, the first magnetic film deposition chamber 52, the second base film deposition chamber 53 and the second magnetic film deposition chamber 54. Then a protective film is deposited in the protective film deposition chambers 50 and the substrate 9 reaches the unload-lock chamber 2 via the spare chamber 500. The substrate is then recovered from the substrate holder 90 in the unload-lock chamber 2.

The empty substrate holder 90 (in the state where no substrate 9 is being held) in the unload-lock chamber 2 is then returned to the load-lock chamber 1 along the return transfer path. In more practical terms, the empty substrate holder 90 is transferred into the film removal chamber 70 at the next timing step. Then it is transferred into the load-lock chamber 1 at the next timing step and the mounting operation of substrates 9 on which no film has yet been deposited is carried out. In this way the substrate holders 90 are circulated around the square transfer path 80 shown in FIG. 1 and used repeatedly for the film deposition process.

When a substrate holder 90 which has been passed around the transfer path 80 in this way for a prescribed number of times and used for a prescribed number of film deposition processes, the film removing mechanism is operated in the way described earlier and the accumulated film on the surface of the holding claws is removed. After how many cycles of film deposition it will be necessary to carry out film removal depends on the thickness of the thin film which is being deposited on the substrates 9 and so it cannot be pre-set but, for example, film removal should be carried out after from 2 to 4 cycles. Of course, film removal can be carried out after each cycle.

In the apparatus of the embodiment which is constructed and operated in the way described above the film removing mechanism is established along the return transfer path whereby the substrate holder is returned from the unload-lock chamber 2 to the load lock chamber 1 and so the construction of the apparatus has the advantage of simplicity. That is to say, when carrying out the film removal operation in the way described earlier it is desirable that the substrate holder should be in a state where no substrate 9 is being held (in the empty state) from the viewpoint of not damaging the substrate 9. In this case, in those cases where the film removing mechanism is not arranged in the return transfer path, for example when it is in the transfer path between the load-lock chamber 1 and the pre-heating chamber 4, the construction is then such that the mounting operation of the substrate 9 is not carried out in the load-lock chamber 1 with the substrate holder which is to be subjected to film removal. In this case it is necessary to amend the drive program of the mounting robot 11 in the load-lock chamber.

Furthermore, if film deposition is carried out when the substrate holder 90 on which no substrate is being held is located in the film deposition chambers 51, 52, 53, 54 and 50 then a film will accumulate in the regions where it should not accumulate in the shadow of the substrate 9 on the surface regions of the holding claws 91. Consequently, the operation of each film deposition chamber 51, 52, 53, 54 and 50 is preferably controlled in such a way that the film deposition operation is not carried out when the substrate holder on which no substrate 9 is being held reaches the film deposition chamber 51, 52, 53, 54 or 50. However, this requires amendment of the control program and it has the disadvantage of complicating the operation of the apparatus as a whole. Moreover, with constructions in which the film removing mechanism is arranged in the transfer path other than the return transfer path the mounting operation of the substrates 9 is carried out after the substrate holder 90 which has been subjected to film removal has been transferred back into the load-lock chamber in an empty state. This part of the transfer operation is wasted operation.

On the other hand, when the film removing mechanism is present in the return path from the unload-lock chamber 2 to the load-lock chamber 1 it is possible to carry out film removal immediately after recovering the substrates 9 on which films have been deposited and it is possible to mount substrates 9 on which films have not been deposited immediately after film removal. Consequently, there is no wasteful movement of the substrate holder 90 and very little amendment of the control program is required. Moreover, the substrate holder 90 is not transferred into any processing chamber in an empty state and so there is no need for amendment of the control program for the processing vacuum chambers 4, and 50 to 54. Consequently, with this embodiment the construction of the apparatus is simple and it is easily applied to existing apparatus. Moreover, the "return path" signifies the pathway when transferring a substrate holder, from which the substrates on which films have been deposited have been recovered, for the mounting of substrates on which films have not been deposited, and it does not depend on the presence or absence of a special mechanism for the transfer.

Furthermore, the establishment of the film removing mechanism in the film removal chamber 70 and the connection in an airtight manner, such that the vacuum is connected, of the film removal chamber 70 to the load-lock chamber 1 and the unload-lock chamber 2 is technically significant in that contamination of the substrate holder 90 with air is prevented. That is to say, if the substrate holder 90 is exposed to the air then, as mentioned earlier, dust, and oxygen and moisture from the air are attached to the surface of the substrate holder. If such contaminants are introduced into the apparatus by way of the substrate holder then there is a risk that the substrates 9 will be contaminated and that the quality of the thin films which are deposited will be adversely affected. However, with this embodiment film removal is carried out in a vacuum and the substrate holder 90 is not exposed to the atmosphere on proceeding from the unload-lock chamber 2 to the load-lock chamber 1 and so there is no risk of such contamination occurring.

Moreover, even in those cases where such atmospheric contaminants have become attached to the surface of a substrate holder 90, there are cases where the contaminants can also be removed at the same time as film removal using the film removing mechanism. Hence, there are cases where the substrate holders may be exposed to the atmosphere between the unload-lock chamber 2 and the film removal chamber 70.

The apparatus of this embodiment generally executes film deposition while transferring the substrate holders 90 in a vacuum even in the part of the transfer path other than the return path without them being exposed to the atmosphere and so atmospheric contaminants are not introduced into the apparatus by way of the substrate holders 90. This fact also reduces contamination of the substrates 9 and the resulting decline is quality.

Moreover, if a substrate holder 90 with a thin film accumulated on the surface is taken out to the atmosphere side the surface of the thin film may be oxidized and foreign material may become attached. If a substrate 9 is subsequently mounted and a thin film is deposited on the surface then further thin film is accumulated on the thin film to the surface of which foreign material has been attached or which has been subjected to oxidation. When such thin films which have different natures are laminated together the stress is high and peeling is liable to occur. Hence the risk of particle formation in the way described earlier is increased. However, with the thin film deposition apparatus of this embodiment the substrate holders 90 are not taken out on the atmosphere side and so there is no problem of this type.

In the embodiments described above the description has focused principally in the removal of the accumulated film from the surfaces of the holding claws 91, but the accumulated film can also be removed from the surface of the holder bodies 92 in the same way, and the number of particles released from the surfaces of the holder bodies 92 can also be reduced.

Furthermore, in the embodiments described above an exclusive film removal chamber 70 which is furnished with a film removing mechanism has been provided, but this is not an essential condition. For example, the film removing mechanism may be provided in the unload-lock chamber 2 or the load-lock chamber 1. In those cases were removal is achieved with the formation of a plasma this is difficult as there is a risk of the mounting robot 11 or the recovery robot 21 being exposed to the plasma, but in those cases were removal is achieved using light or ultrasonic waves this is a practical proposition. However, if an exclusive film removal chamber 70 is used there is an advantage in that a mechanism such as plasma formation or the use of a reactive gas, for example, can be selected freely.

Moreover, the film removal chamber 70 need not be established immediately adjacent to the load-lock chamber 1 and the unload-lock chamber 2, and other vacuum chambers may be included in between. The requirement is that the vacuum should be maintained continuously.

In the description above the substrate holders 90 have been holders where the circumferential edges of the substrates 9 are held by the holding claws 91, but with substrates which have a circular hole in the center, such as the substrates used for information recording disks, the edge of the central hole may be engaged. However, with a construction in which the holding claws are engaged on the edge of a central hole it is impossible in view of the structure on which the holding claws are established to deposit films on both sides of the substrate at the same time. Furthermore, most recently very small information recording disks such as the hard disks for use in notebook computers have come to the fore and it is difficult to engage such miniature substrates using the edge of the central hole. Hence, the construction which engages the circumferential edge of the substrate 9 has the advantages of enabling film deposition to be carried out on both sides simultaneously and of being equally effective with miniature substrate.

Moreover, it is also possible to adopt a construction in which a plurality of substrate holders are held in the film removal chamber 70. That is to say, the construction may be such that film removal is carried out with a plurality of substrate holders 90 all at the same time by operating the film removing mechanism after a plurality of substrate holders 90 which require film removal have been introduced.

As described above, by means of the present invention, the accumulated film can be removed from the surface of the substrate holders and so the problems such as the formation of particles caused by the peeling off of the accumulated film are suppressed. Moreover, the accumulated films are removed from the surface without taking the substrate holders out into the atmosphere and so there is no need for means of cleaning the substrate holders after the films have been removed or pumping out again from atmospheric pressure and any marked fall in productivity can be avoided.

In addition to the abovementioned effects, the accumulated films are removed from the surfaces of the substrate holders in a state where no substrate is being held and so there is no danger of a substrate being damaged by the accumulated film removing operation.

Furthermore, in addition to the abovementioned effects, the film removing time can be determined irrespective of the step time and the reduction in productivity and the occurrence of wasted time when the step time is determined by the film removing time are suppressed.

Furthermore, the substrate holders from which the accumulated film has been removed can be set to the same state as the other substrate holders and so film deposition can be carried out with a high degree of reproducibility, and the fall in productivity at this time is also suppressed.

Moreover, in the FIG. 9 embodiment, the film removing mechanism is established on the return path from the unload-lock chamber to the load-lock chamber and so there is no wasteful movement of the substrate holders and the construction of the apparatus is simplified.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method of removing accumulated film from a surface of a substrate holder in a film deposition apparatus in which apparatus a prescribed thin film is formed on a substrate while the substrate is being held by the substrate holder in a film deposition chamber which is being maintained in a vacuum, comprising the steps of:

moving the substrate holder from the film deposition chamber to another vacuum chamber which is connected in an airtight manner to the film deposition chamber, without exposing the substrate holder to atmosphere; and removing the accumulated film from the surface of the substrate holder under vacuum, wherein the removal is carried out when no substrate is being held in the substrate holder.

2. The method of claim 1, wherein the removing step includes causing the accumulated film to peel away from the surface of the substrate holder by imparting heat, light or electrical energy to the accumulated film.

3. The method of claim 1, wherein the removing step includes causing the accumulated film to peel away from the surface of the substrate holder by radiating ions onto the accumulated film and the accumulated film is sputter-etched by the ions.

4. The method of claim 1, wherein the removing step includes causing the accumulated film to peel away from the surface of the substrate holder by delivering a reactive gas to the substrate holder and creating a reaction between the reactive gas and the accumulated film.

5. The method of claim 1, wherein the substrate is a substrate for information-recording disk purposes.

6. The method of claim 1, wherein the substrate holder comprises holding claws which engage with a circumferential edge of the substrate and a holder body to which the holding claws are fixed, and the removing step includes removal of the accumulated film from a surface of the holding claws.

7. A film deposition apparatus, comprising:

a sputter chamber in which a film is formed on a surface of a substrate by means of sputtering;

other vacuum chambers which are connected with the sputter chamber in an air-tight manner such that a vacuum is maintained throughout the chambers;

a substrate holder for holding the substrate when the film is being formed in the sputter chamber, the substrate holder having a surface;

an auto-loader which loads the substrate onto the substrate holder; and film removing means for removing accumulated film from the surface of the substrate holder in a vacuum, wherein the film removing means is established in one of the aforementioned chambers; and a controller which controls the autoloader, wherein the controller executes control such that the substrate holder is not holding the substrate when the film removing means is removing the accumulated film.

8. The film deposition apparatus of claim 7, wherein the film removing means includes means for imparting heat, light or electrical energy to the accumulated film.

9. The film deposition apparatus of claim 7, wherein the film removing means includes means for radiating ions onto the accumulated film and the accumulated film is sputter-etched by the ions.

10. The film deposition apparatus of claim 7, further comprising a film removal chamber in which the removal is carried out exclusively, the film removal chamber is connected directly or indirectly with the sputter chamber in such a way that the vacuum is connected, and the film removing means is established in the film removal chamber.

11. The film deposition apparatus of claim 7, wherein the substrate is a substrate for information-recording disk purposes.

12. The film deposition apparatus of claim 7, wherein the substrate holder comprises holding claws which engage with a circumferential edge of the substrate and a holder body to which the holding claws are fixed, and the aforementioned film removing means is a mechanism which carries out the removal of the accumulated film from the surface of the holding claws.

13. A film deposition apparatus, comprising:

a film deposition chamber in which a film is formed on a surface of a substrate;

other vacuum chambers which are connected with the film deposition chamber in an air-tight manner such that a vacuum is maintained throughout the chamber;

a substrate holder for holding the substrate when the film is being formed in the film deposition chamber, the substrate holder having a surface;

an autoloader which loads the substrate onto the substrate holder; and film removing means for removing accumulated film from the surface of the substrate holder in a vacuum, wherein the film removing means is established in one of the aforementioned chambers; and a controller which controls the autoloader, wherein the controller executes control such that the substrate holder is not holding the substrate when the film removing means is removing the accumulated film.

14. The film deposition apparatus of claim 13, wherein film removing means includes means for imparting heat, light or electrical energy to the accumulated film.

15. The film deposition apparatus of claim 13, wherein film removing means includes means for radiating ions onto the accumulated film and the accumulated film is sputter-etched by the ions.

16. The film deposition apparatus of claim 13, further comprising a film removal chamber in which the removal is carried out exclusively, the film removal chamber is connected directly or indirectly with the film deposition chamber in such a way that the vacuum is connected, and the film removing means is established in the film removal chamber.

17. The film deposition apparatus of claim 13, wherein the substrate is a substrate for information-recording disk purposes.

18. The film deposition apparatus of claim 13, wherein the substrate holder comprises holding claws which engage with a circumferential edge of the substrate and a holder body to which the holding claws are fixed, and the aforementioned film removing means is a mechanism which carries out the removal of the accumulated film from the surface of the holding claws.

19. A film deposition apparatus, comprising:

a sputter chamber in which a film is formed on a surface of a substrate by means of sputtering;

other vacuum chambers which are connected with the sputter chamber in an air-tight manner such that a vacuum is maintained throughout the chambers;

a substrate holder for holding the substrate when the film is being formed in the sputter chamber, the substrate holder having a surface;

film removing means for removing accumulated film from the surface of the substrate holder in a vacuum;

wherein the film removing means is established in one of the aforementioned chambers;

a film removal chamber in which the removal is carried out exclusively, the film removal chamber is connected directly or indirectly with the sputter chamber in such a way that the vacuum is connected, and the film removing means is established in the film removal chamber;

wherein the sputter chamber and the other vacuum chambers are established in an airtight manner along an endless transfer path, and further comprising a transfer mechanism which causes the aforementioned substrate holder to move along the transfer path, and moreover, the film removal chamber is connected in an airtight manner with the sputter chamber or one of the other vacuum chambers, in such a way that it branches off the transfer path.

20. The film deposition apparatus of claim 19, wherein one of the other vacuum chambers is a load-lock chamber in which the substrate is mounted onto the substrate holder, and the film removal chamber is established branching from a part of the transfer path between the load-lock chamber and the vacuum chamber for processing purposes into which the substrate holder which has been moved from the load-lock chamber is moved initially.

21. A film deposition apparatus, comprising:

a film deposition chamber in which a film is formed on a surface of a substrate;

other vacuum chambers which are connected with the film deposition chamber in an air-tight manner such that a vacuum is maintained throughout the chambers;

a substrate holder for holding the substrate when the film is being formed in the film deposition chamber, the substrate holder having a surface;

film removing means for removing accumulated film from the surface of the substrate holder in a vacuum;

wherein the film removing means is established in one of the aforementioned chambers;

a film removal chamber in which the removal is carried out exclusively, the film removal chamber is connected directly or indirectly with the film deposition chamber in such a way that the vacuum is connected, and the film removing means is established in the film removal chamber;

wherein the film deposition chamber and the other vacuum chambers are established in an airtight manner along an endless transfer path, and further comprising a transfer mechanism which causes the aforementioned substrate holder to move along the transfer path, and moreover, the film removal chamber is connected in an airtight manner with the film deposition chamber or one of the other vacuum chambers, in such a way that it branches off the transfer path.

22. The film deposition apparatus of claim 21, wherein one of the other vacuum chambers is a load-lock chamber in which the substrate is mounted onto the substrate holder, and the film removal chamber is established branching from a part of the transfer path between the load-lock chamber and the vacuum chamber for processing purposes into which the substrate holder which has been moved from the load-lock chamber is moved initially.

23. A thin film deposition apparatus, comprising:

a load-lock chamber;

an unload-lock chamber;

a film deposition chamber in which a prescribed thin film is deposited in a vacuum on a surface of a substrate;

the chambers being connected in an airtight manner so that a vacuum can be maintained in the chambers;

a transfer mechanism which transfers a substrate holder on which the substrate is supported sequentially through the load-lock chamber, the film deposition chamber, and the unload-lock chamber;

a return transfer path whereby the substrate holder from which the substrate on which the film has been deposited has been recovered in the unload-lock chamber is returned to the load-lock chamber; and a film removing mechanism which removes a film which has accumulated on a surfaces of the substrate holder is established in the return transfer path.

24. The thin film deposition apparatus of claim 23, further comprising a film removal chamber furnished with the film removing mechanism in the return transfer pathway, and said film removal chamber is connected in an airtight manner so that the removal of film which has accumulated on the surface of the substrate holder is carried out in a vacuum, and the vacuum is connected to the unload-lock chamber and the load-lock chamber.

25. The thin film deposition apparatus of claim 23, wherein the film removing mechanism is such that the film removal is achieved by directing ions onto the accumulated film and the accumulated film is sputter etched by the ions.

26. The thin film deposition apparatus of claim 23, wherein the substrate is for information recording disk purposes.

27. The thin film deposition apparatus of claim 26, wherein the substrate holder comprises holding claws which engage circumferential edges of the substrate and a supporting body to which the holding claws are fixed, and the film removing mechanism removes the accumulated film on the surface of the holding claws.

* * * * *